United States Patent
Sano et al.

(10) Patent No.: US 9,368,601 B2
(45) Date of Patent: Jun. 14, 2016

(54) METHOD FOR FORMING OXIDE BELOW CONTROL GATE IN VERTICAL CHANNEL THIN FILM TRANSISTOR

(71) Applicant: SanDisk 3D LLC, Milpitas, CA (US)

(72) Inventors: Michiaki Sano, Aichi (JP); Kensuke Yamaguchi, Yokkaichi (JP); Akira Nakada, Yokkaichi (JP); Naohito Yanagida, Yokkaichi (JP)

(73) Assignee: SanDisk Technologies Inc., Plano, TX (US)

( * ) Notice: Subject to any disclaimer, the term of this patent is extended or adjusted under 35 U.S.C. 154(b) by 44 days.

(21) Appl. No.: 14/193,451

(22) Filed: Feb. 28, 2014

(65) Prior Publication Data

US 2015/0249143 A1   Sep. 3, 2015

(51) Int. Cl.
| | |
|---|---|
| *H01L 21/336* | (2006.01) |
| *H01L 29/66* | (2006.01) |
| *H01L 29/78* | (2006.01) |
| *H01L 21/28* | (2006.01) |
| *H01L 29/04* | (2006.01) |
| *H01L 27/115* | (2006.01) |

(52) U.S. Cl.
CPC .... *H01L 29/66666* (2013.01); *H01L 21/28238* (2013.01); *H01L 27/11556* (2013.01); *H01L 27/11582* (2013.01); *H01L 29/04* (2013.01); *H01L 29/7827* (2013.01)

(58) Field of Classification Search
CPC .................................................. H01L 29/66666

USPC .......................................................... 438/268
See application file for complete search history.

(56) References Cited

U.S. PATENT DOCUMENTS

| | | | |
|---|---|---|---|
| 6,995,053 B2 | 2/2006 | Schuele et al. | |
| 7,453,113 B2 | 11/2008 | Ouyang et al. | |
| 8,237,220 B2 | 8/2012 | Sung et al. | |
| 8,427,859 B2 | 4/2013 | Sandhu et al. | |
| 8,569,831 B2 | 10/2013 | Heineck et al. | |
| 2003/0161201 A1 | 8/2003 | Sommer et al. | |
| 2012/0147648 A1* | 6/2012 | Scheuerlein | G11C 13/0002 365/51 |
| 2013/0308363 A1 | 11/2013 | Scheuerlein | |

OTHER PUBLICATIONS

U.S. Appl. No. 13/788,990, filed Mar. 7, 2013.

* cited by examiner

*Primary Examiner* — Hsin-Yi Hsieh
(74) *Attorney, Agent, or Firm* — Vierra Magen Marcus LLP

(57) ABSTRACT

A fabrication process for a vertical channel transistor provides a desired control gate-to-drain overlap and sufficient isolation between the control gate and an underlying metal line. A body of the transistor is formed on a metal line, such as in a pillar shape. The metal line is oxidized to form metal oxide regions having an expanded volume. A gate insulator material and a control gate material are then deposited. The resulting structure is etched to form separate control gates for each transistor, and to expose the metal oxide. A further etch is performed to remove the metal oxide, forming voids under and around the control gates. An insulation fills the voids. An example implementation is a vertical bit line memory device in which the transistors connect a vertical bit line to a horizontal bit line.

20 Claims, 21 Drawing Sheets

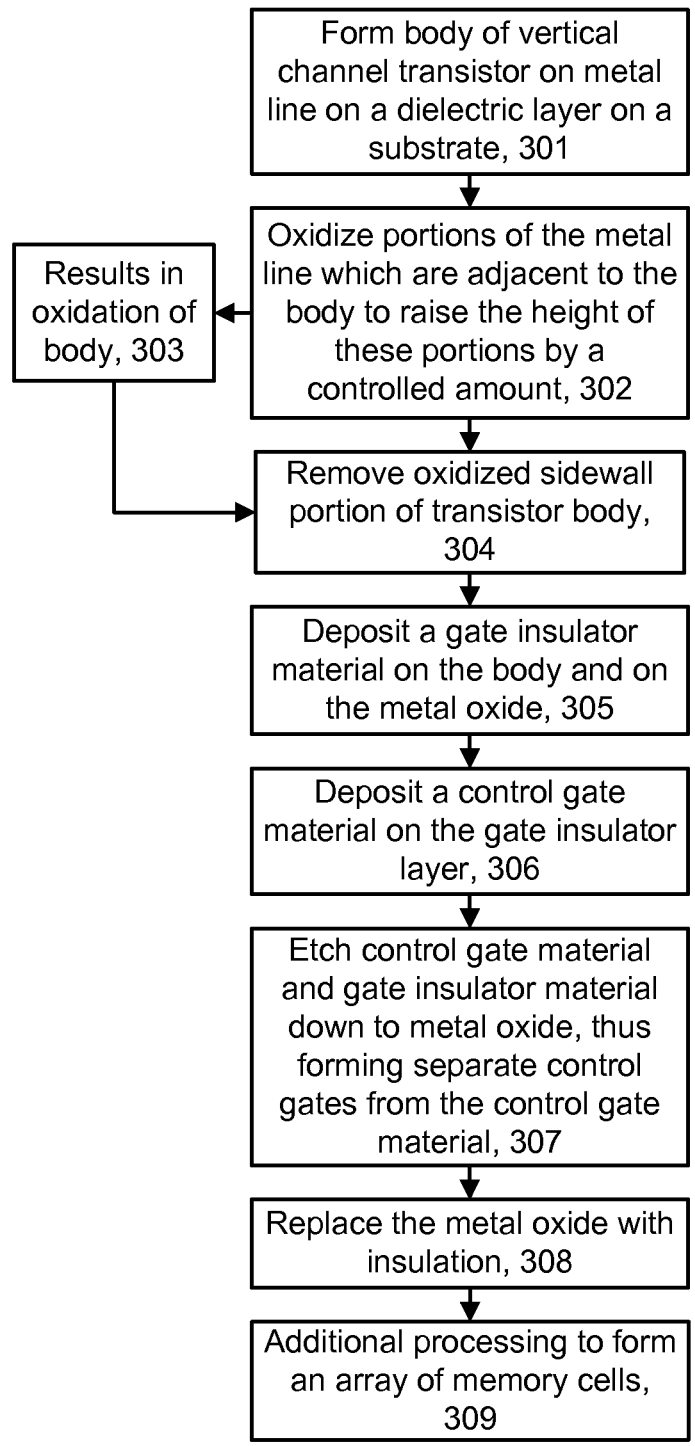

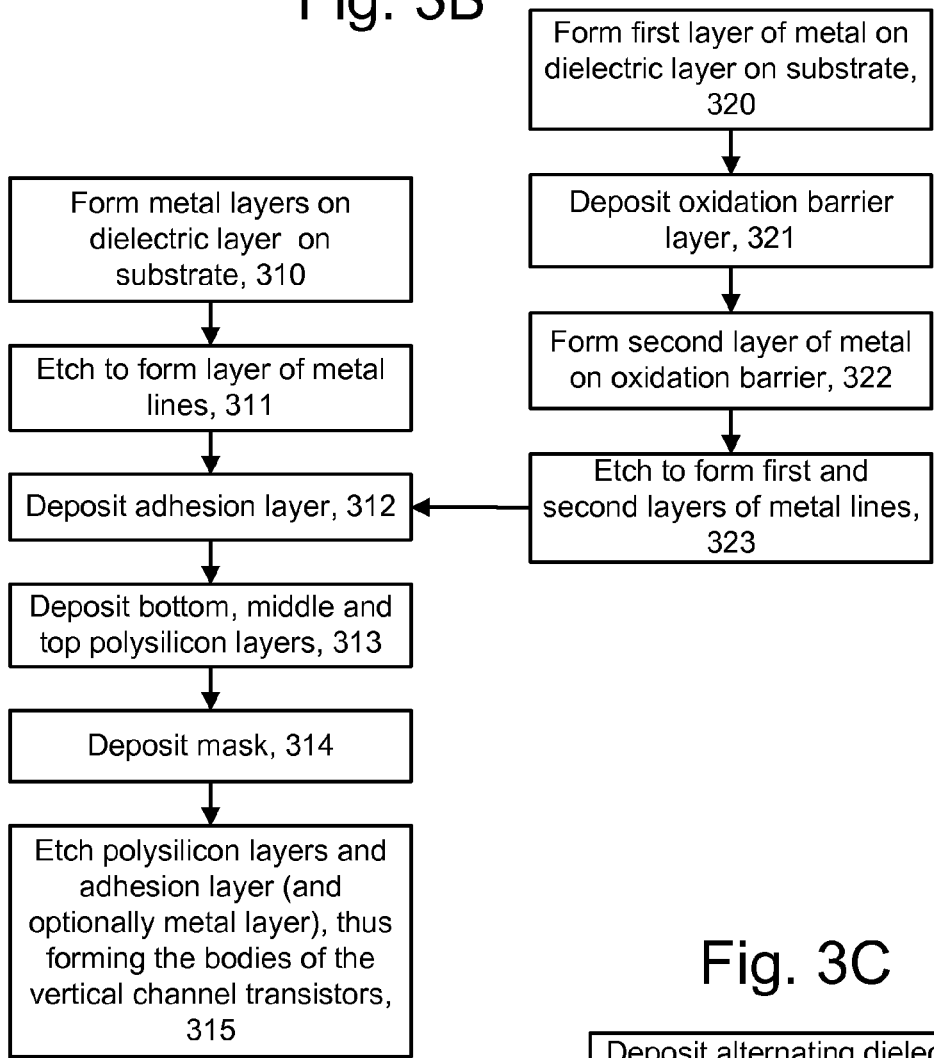
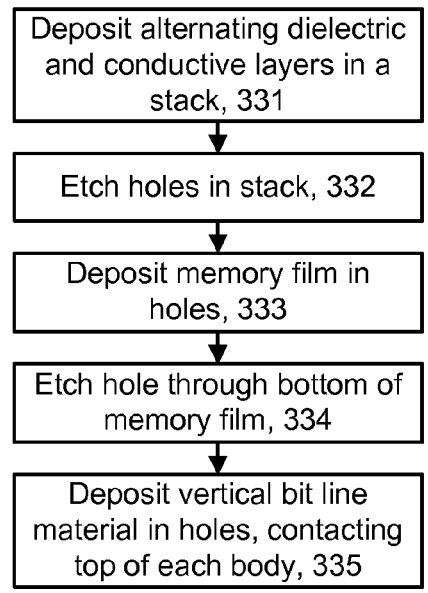

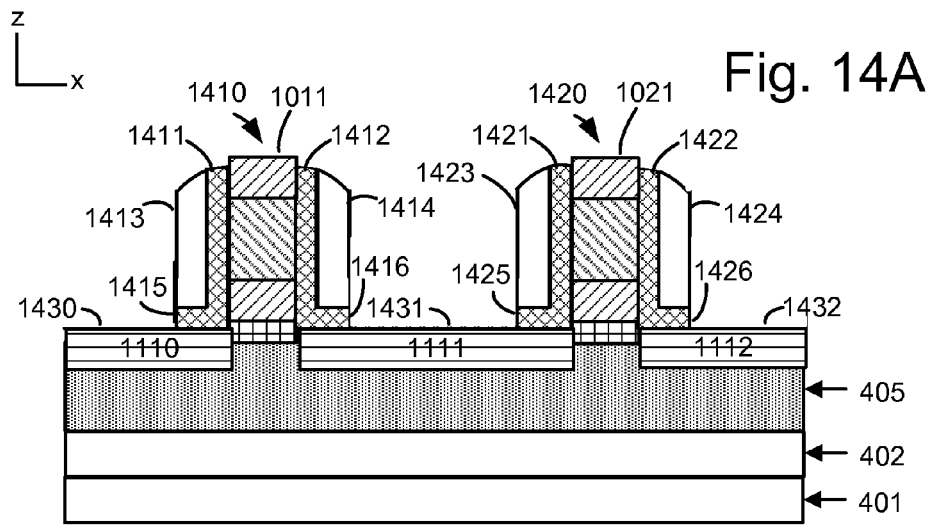
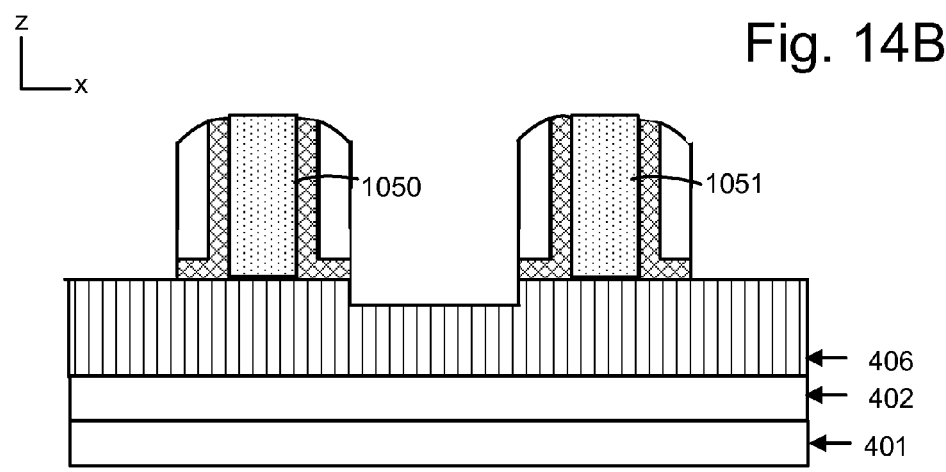
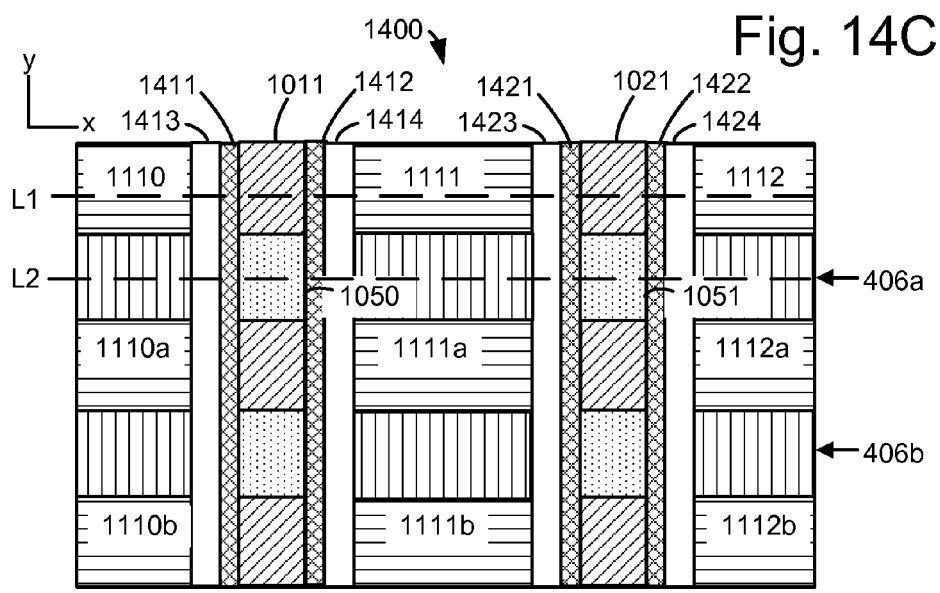

METHOD FOR FORMING OXIDE BELOW CONTROL GATE IN VERTICAL CHANNEL THIN FILM TRANSISTOR

BACKGROUND

The present technology relates to a fabrication process for a vertical channel transistor such as in a memory device, and to a corresponding structure.

Vertical channel transistors which are fabricated from layers of thin films can be used in various applications. For example, these transistors can be used as bit line select transistor in a vertical bit line (VBL) memory device. A VBL memory device can include a resistance-change memory film which exhibits resistance-switching behavior, in which the resistance of the material is a function of the history of the current through, and/or voltage across, the memory film. The memory film can extend vertically along sides of holes in a stack. The stack comprises alternating word line layers and dielectric layers, where the vertical bit line extends in a central portion of each hole. A memory cell is formed by the intersection of each word line layer with the memory film. A vertical channel transistor can be provided below each vertical bit line to control the flow of current to the bit line from a global bit line which is below the vertical channel transistor, such as during a read or program operation.

BRIEF DESCRIPTION OF THE DRAWINGS

FIG. 3A depicts an example process for fabricating a transistor such as depicted in FIG. 2B.

FIG. 3B depicts example steps for forming bodies of vertical channel transistors as set forth in step 301 of FIG. 3A.

FIG. 3C depicts example steps for carrying out the additional processing of step 309 of FIG. 3A.

FIGS. 4A to 16C and 18A to 19C depict various stages of a semiconductor material in a fabrication process consistent with FIG. 3A.

FIG. 4A depicts a cross-sectional view along line L1 of the semiconductor material 400 of FIG. 4C, in a region where transistors are formed.

FIG. 14A depicts a cross-sectional view along line L1 of the semiconductor material 1400 of FIG. 14C, following an etching operation consistent with step 307 of FIG. 3A.

FIG. 14B depicts a cross-sectional view along line L2 of the semiconductor material 1400 of FIG. 14C, following the etching operation.

FIG. 14C depicts a top view of a semiconductor material 1400, following the etching operation.

FIG. 16C depicts a top view of a semiconductor material 1600, showing a layer of insulation.

FIG. 18A depicts an alternative cross-sectional view along line L1 of the semiconductor material 1000 of FIG. 10C, where a portion of the metal layer 405 is etched.

FIG. 19C depicts a final configuration of transistors 1930 and 1940 consistent with FIGS. 19A and 19B.

DETAILED DESCRIPTION

The present technology relates to a fabrication process for a vertical channel transistor such as in a memory device, and to a corresponding vertical channel transistor structure.

A vertical channel transistor includes a body and a control gate. The body includes a drain region, a source region and a channel region between the drain and source regions. The control gate is spaced apart from the body by a gate insulator material and extends along the side of the body, from the drain region to the source region. Further, the control gate can overlap the drain and source regions by a specified amount. If the overlap is too little or too great, the transistor may not operate properly. For example, the amount of overlap with the drain, at the bottom of the body, affects the threshold voltage of the transistor. Moreover, the control gate overlap should be set so that there is sufficient space for a relatively thick insulating material between the control gate and the global bit line, to isolate the control gate from the global bit line. Accurate control of the control gate-to-drain overlap of the vertical channel transistor is desirable.

Fabrication techniques provided herein address the above and other issues. In various embodiments, the techniques involve providing metal lines in a substrate, forming transistors above the metal lines, and forming vertical bit lines in a stack of memory cells above the transistors. The transistors are fabricated by forming layers of the vertical channel transistor, such as doped and/or undoped polysilicon layers, above the substrate and etching through these layers, down to the metal lines. An oxidation is performed to oxidize regions of the metal lines. The oxidized regions expand in volume so that a height of the oxidized regions is higher than a height of the original, non-oxidized metal lines. A gate insulator material and a control gate material are then deposited and etched, and the metal oxide regions are removed and replaced by an insulating material. The control gate is therefore spaced apart from the metal lines based on the thickness of the metal oxide regions and the thickness of the gate insulator material. These thicknesses can be controlled in a predictable way to achieve a consistent spacing.

Figure 1:
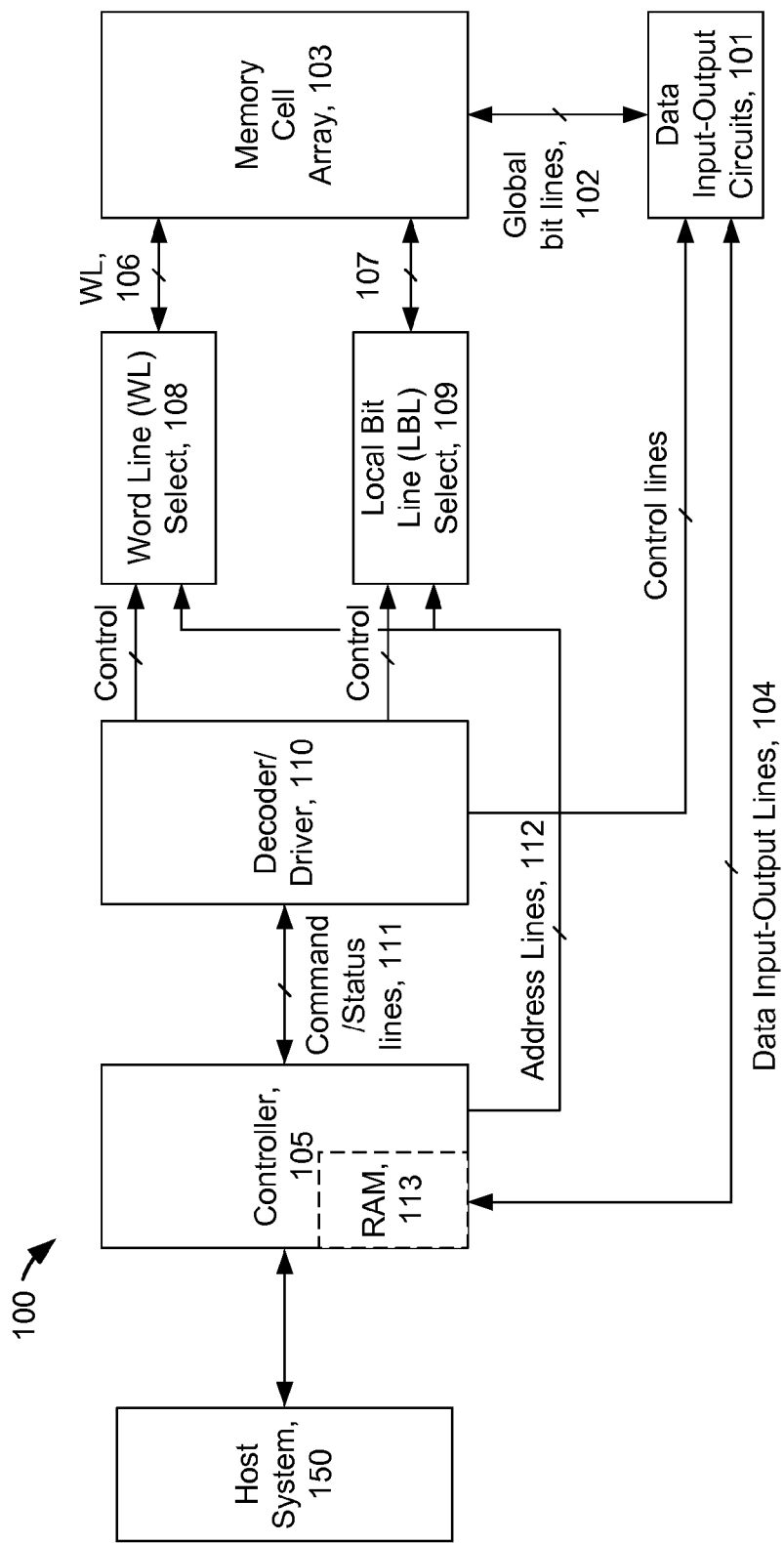
FIG. 1 is a schematic block diagram of a re-programmable non-volatile memory system connected to a host system.

FIG. 1 is a schematic block diagram of a re-programmable non-volatile memory system 100 connected to a host system 150.

Data input-output circuits 101 are connected to provide and receive analog electrical signals in parallel over global bit lines (GBLs) 102, also referred to as metal lines herein. The signals represent data stored in addressed memory elements in a memory cell array 103. The data input-output circuits may include sense amplifiers for converting these electrical signals into digital data values during reading. The digital values are then sent over data input-output lines 104 to a controller 105. Conversely, data to be programmed into the memory array is sent by the controller to the data input-output circuits, which program the data into the addressed memory elements by placing appropriate voltages on the global bit lines. For binary operation, one voltage level is typically placed on a global bit line to represent a binary "1" and another voltage level to represent a binary "0". The memory elements are addressed for reading or programming by voltages placed on the word lines (WLLs) 106 and row select lines 107 by respective word line select circuits 108 and local bit line select circuits 109. In an example three-dimensional array, the memory elements between a selected word line and any of the local bit lines connected through the select transistors to the global bit lines may be addressed for programming or reading by appropriate voltages being applied through the select circuits 108 and 109.

The select transistors may be provided as vertical channel transistors as described further below in detail.

The controller 105 receives data from and sends data to the host system 150. The controller can include a random access memory (RAM) 113 for temporarily storing this data and associated information. Commands, status signals and addresses of data being read or programmed are also exchanged between the controller and the host. The memory system can operate with various host systems such as personal computers (PCs), laptops and other portable computers, cellular telephones, personal digital assistants (PDAs), digital still cameras, digital movie cameras and portable audio players. The host typically connects to the memory system using a built-in receptacle (for receiving a memory card or flash drive that comprises the memory system) or by a wired or wireless path. Alternatively, the memory system may be built into the host system.

The controller conveys commands received from the host to decoder/driver circuits 110 via lines 111. Similarly, status signals are communicated to the controller the from decoder/driver circuits. The decoder/driver circuits 110 can be simple logic circuits, where the controller controls nearly all of the memory operations, or the circuits can include a state machine to control at least some of the repetitive memory operations necessary to carry out given commands. Control signals resulting from decoding commands are applied from the decoder/driver circuits to the word line select circuits 108, local bit line select circuits 109 and data input-output circuits 101. Also connected to the decoder/driver circuits are address lines 112 from the controller that carry physical addresses of memory elements to be accessed within the array 103 in order to carry out a command from the host. The physical addresses correspond to logical addresses received from the host system, where the conversion is made by the controller and/or the decoder/driver circuits. As a result, the local bit line select circuits partially address the designated storage elements within the array by placing appropriate voltages on the control gates of the select transistors to connect selected local bit lines with the global bit lines. The addressing is completed by the decoder/driver circuits applying appropriate voltages to the word lines of the array.

The memory system of FIG. 1 can be implemented as a three-dimensional memory array such as depicted in FIG. 2, in an example embodiment. Although each of the memory elements in the memory array may be individually addressed to be programmed or read, it is also possible to program or read sets of memory cells in parallel. For example, one row of memory elements on one plane may be programmed and read in parallel. The number of memory elements programmed or read in parallel depends on the number of memory elements connected to the selected word line. In some arrays, the word lines may be segmented so that only a portion of the total number of memory elements connected along their length may be addressed for parallel operation, namely the memory elements connected to a selected one of the segments. In some arrays, the number of memory elements programmed in one operation may be less than the total number of memory elements connected to the selected word line.

Previously programmed memory elements whose data have become obsolete may be addressed and re-programmed from the states in which they were previously programmed. The starting states can differ among the memory elements being re-programmed in parallel. In some cases, a group of memory elements is reset to a common state before they are re-programmed. For example, the memory elements may be grouped into blocks, where the memory elements of each block are simultaneously reset to a common state, e.g., an erased state, in preparation for subsequently programming them.

The individual blocks of memory elements may be further divided into a plurality of pages of storage elements, wherein the memory elements of a page are programmed or read together.

Figure 2A:
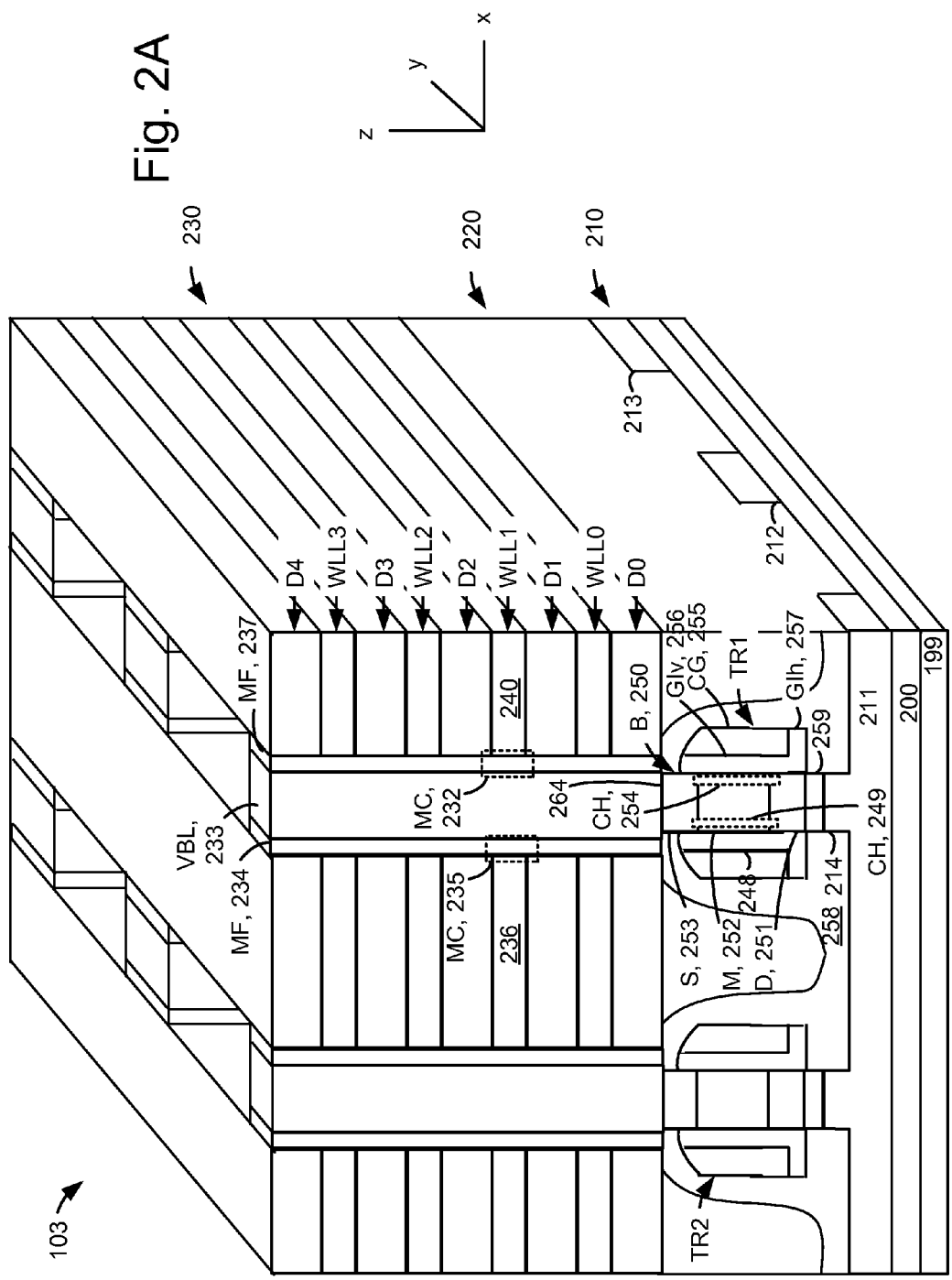
FIG. 2A depicts a perspective view of an example memory array of the non-volatile memory system of FIG. 1.

FIG. 2A depicts a perspective view of an example memory array 103 of the non-volatile memory system of FIG. 1. The memory array includes a dielectric material 200 on a substrate 199. Logic circuits 198 (FIG. 2B) may also be formed on the substrate, under the memory array. A metal layer 210 is on the dielectric material 200 and comprises metal lines 211, 212 and 213. A transistor layer 220 on the metal layer includes example transistors TR1 and TR2. A stack 230 on the transistor layer include alternating dielectric layers D0-D4 (e.g., TEOS or SiO2) and conductive word line layers WLL0-WLL3 (e.g., metal, metal silicide or doped polysilicon). Holes are etched in the stack and filled with a memory film (e.g., memory film MF 234 and 237) and a conductive material which forms vertical bit lines (e.g., VBL 233). The memory film can comprise a resistance-switching material which can be configured in two or more resistance states to represent corresponding data states. A memory cell is formed in a portion of a memory film which is adjacent to a word line layer. The word line layer acts as one electrode of the memory cell and the vertical bit line acts as another electrode of the memory cell. For example, a memory cell MC 232 is formed in a portion of the MF 237 adjacent to the WLL1 portion 240, with electrodes provided by the WLL1 portion 240 and by VBL 233. Another example memory cell MC 235 is formed in a portion of the MF 234 adjacent to the WLL1 portion 236, with electrodes provided by the WLL1 portion 236 of VBL 233.

The example memory array includes six vertical bit lines in two row, with three VBLs per row. Each word line layer includes three memory cells in each row, for a total of twenty four memory cells in the array. A bottom of each vertical bit line (e.g., bottom 264 in FIG. 2A) is connected to the top of a respective vertical channel transistor (e.g., top 207 in FIG. 2B). Two transistors are depicted in cross-section along the x-z plane. Each transistor may include a body (comprising a source, middle or channel portion and a drain), and one or more control gates proximate to the body and separated from the body by a gate insulator material. A bottom of each transistor may be connected (directly or indirectly via another material such as an adhesion layer) to a horizontal metal line such as a global bit line. An adhesion layer may be provided between the metal line and the body of the transistor. For example, the transistor TR1 includes a body B 250 having a drain region D 251, a middle portion M 252 above the drain region and a source region S 253 above the middle portion. The transistor also include a control gate CG 255 which is spaced apart from the body by a vertical portion GIv 256 of a gate insulator material. The gate insulator material may also include a horizontal portion GIh 257.

In one option, the control gates are straight (rail shaped), and two straight control gates extend in the y direction and are used to control one row of transistors. For example, one control gate 248 can provide a channel 249 in one half of the body of the transistor to allow the metal line 211 to communicate with the VBL. Another control gate 255 can provide a channel 254 in the other half of the body of the transistor to allow the metal line to communicate with the VBL.

In another option, the gate insulator material surrounds the body of the transistor, e.g., in a circular shape (in the x-y plane). In this case, the control gates 248 and 255 are part of the same control gate and the channels 249 and 254 are part of the same channel.

An insulation 258 may surround the transistors in the transistor layer 220. A further insulation may be provided in the transistor layer and between the vertical bit lines (not shown).

An example adhesion layer 259 may be provided between a pedestal region 214 of the metal line 211 and the drain 251 of the transistor TR1. The channel 254 and/or 249 may be formed in the body when a sufficient gate-to-drain voltage is applied to the transistor.

A Cartesian coordinate system which is used in various figures indicates a vertical direction (z) and lateral directions x and y.

The memory film can be of various types. Example memory films include chalcogenides, carbon polymers, perovskites, and certain metal oxides (MeOx) and metal nitrides (MeN). Specifically, there are metal oxides and nitrides which include only one metal and exhibit reliable resistance switching behavior. This group includes, for example, Nickel Oxide (NiO), Niobium Oxide (Nb2O5), Titanium Dioxide (TiO2), Hafnium Oxide (HfO2) Aluminum Oxide (Al2O3), Magnesium Oxide (MgOx), Chromium Dioxide (CrO2), Vanadium Oxide (VO), Boron Nitride (BN), and Aluminum Nitride (AlN). The material may be formed in an initial state, for example, a relatively low-resistance state. Upon application of sufficient voltage, the material switches to a stable high-resistance state which is maintained after the voltage is removed. In some cases, the resistance switching is reversible such that subsequent application of an appropriate current or voltage can serve to return the material to a stable low-resistance state which is maintained after the voltage or current is removed. This conversion can be repeated many times. For some materials, the initial state is high-resistance rather than low-resistance. A set process may refer to switching the material from high to low resistance, while a reset process may refer to switching the material from low to high resistance. The set and reset processes can be considered to be programming processes which change the resistance state. In other cases, the resistance switching is irreversible.

Resistance-change materials are of interest for use in non-volatile memory arrays. One resistance state may correspond to a data "0," for example, while the other resistance state corresponds to a data "1." Some of these materials may have more than two stable resistance states.

Note that the use of the vertical channel transistor in a memory device as depicted is one example implementation, and other implementations are possible. A vertical channel transistor can be used generally to provide an electrical connection between a component below the transistor and a component above the transistor.

Figure 2B:
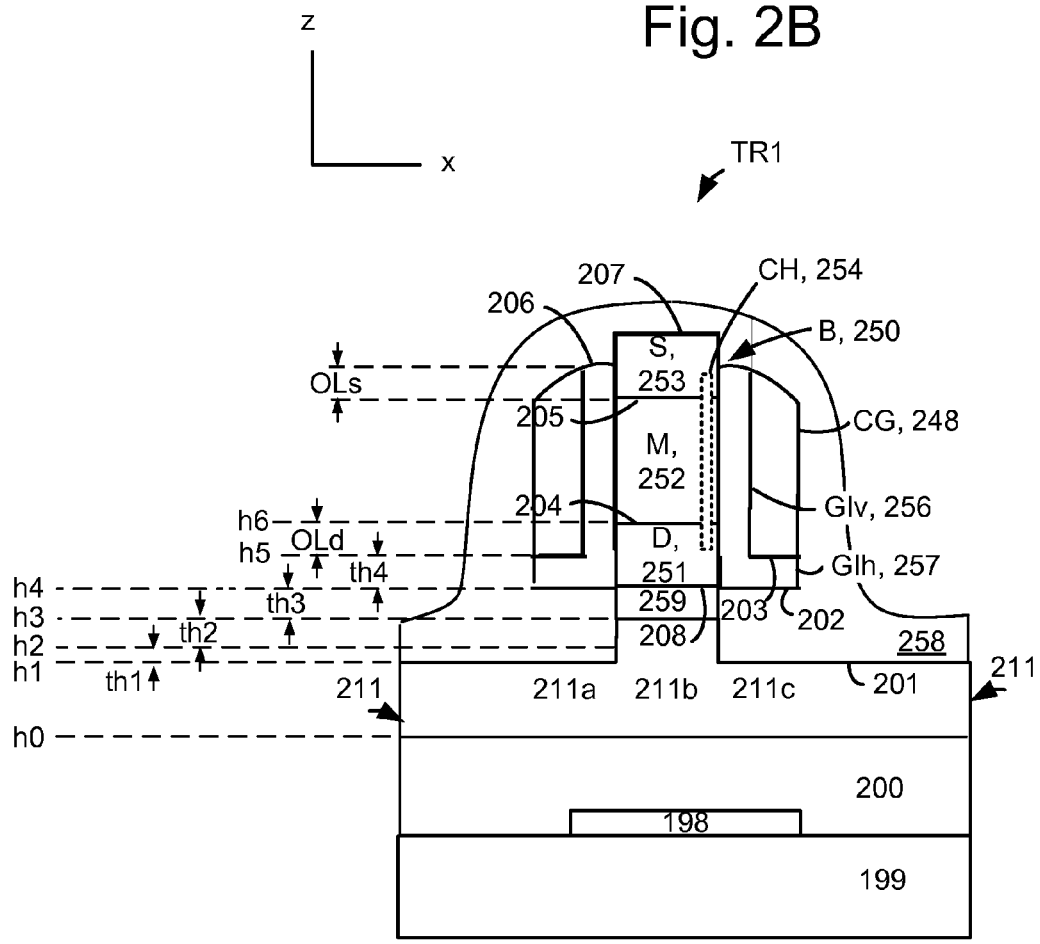
FIG. 2B depicts an enlarged view of the transistor TR1 of FIG. 2A.

FIG. 2B depicts an enlarged view of the transistor TR1 of FIG. 2A. As mentioned, the transistor can be formed on a dielectric material 200 on a substrate, where logic circuits 198 are also provided on the substrate. The logic circuits may control the transistor, for instance. A height value extends in the vertical (z) direction. A height h0 represents the bottom of the metal line 211. The metal line comprises lower, non-pedestal portions 211a and 211c adjacent to a higher, pedestal portion 211b.

A height h1 represents a top surface 201 of the metal line or a bottom surface of the metal oxide which is no longer present, or a bottom surface of the insulation 258 which is present. A thickness th1+th2+th3 is the thickness of the insulation 258 between the bottom of the GIh 257 and the top of the metal line 211. A height h2 is a dividing line between a non-oxidized portion of the metal line 211 below the dividing line and an oxidized portion of the metal line (e.g., metal oxide portions 1110-1112 in FIG. 11A, or metal oxide portions 1941-1943 in FIG. 19B) above the dividing line. A height h2 represents the top surface of the metal line before it is oxidized and after it is etched. A height h3 represents the top surface of the metal line before it is oxidized and before it is etched. H3 is also the height of the bottom of the adhesion layer. A height h4 represents the bottom surface 202 of the horizontal gate insulator material GIh 257. This height is depicted as being similar to, but is not necessarily the same as, the height of the top of the adhesion layer portion. A height h5 represents the top surface 203 of the horizontal gate insulator material GIh 257, and the bottom surface of the control gate 248. A height h6 represents the bottom surface of the middle 252 of the transistor body, or the top surface of the drain 251 of the transistor body.

A thickness th1 is the distance between h1 and h2 and is the thickness of the metal line which is replaced by metal oxide. A thickness th2 is the distance between h2 and h3 and is the thickness of the metal oxide which is formed above the top surface of the metal line. A thickness th3 is the distance between h3 and h4 and is the thickness of the adhesion layer. A thickness th4 is the distance between h4 and h5 and is the thickness of the horizontal portion of the gate insulator material GIh 257 (as well as the thickness of the vertical portion of the gate insulator material GIv 256). A distance OLd is the distance between h5 and h6 and is the overlap of the control gate 248 relative to the drain 251, e.g., a vertical distance between the top of the drain 204 and the bottom portion 203 of the control gate. This is the gate-to-drain overlap. A distance OLs is the overlap of the control gate 248 relative to the source 253, e.g., a vertical distance between the bottom of the source 205 and the top portion of the control gate 206. This is the gate-to-source overlap. As mentioned, the overlap of the control gate with respect to the body of the transistor should be carefully controlled to ensure that the transistor operates as expected. Each transistor body (e.g., a polysilicon structure, which is a portion of the transistor in which a vertical channel can be formed) has a bottom 208 which is electrically connected to the global bit line and a top 207 which is electrically connected to a vertical bit line in the memory device, in the example implementation.

In one possible approach, the source and drain regions are p+ type and the middle region is intrinsic. In another possible approach, the source and drain regions are n+ type and the middle region is p− type. Other variations are possible.

The techniques provided herein provide for accurate control of the position of the bottom of the control gate to provide consistent transistor performance. Additionally, the techniques can provide a thicker oxide below control gates relative to the thickness of the gate insulator material, to provide isolation from the metal line. That is, a distance (h5-h1) between bottom portions of the control gates and bottom portions of the metal oxide regions is greater than a thickness (th4) of vertical portions of the gate insulator material. For example, the isolation material can have a dielectric strength which protects against a voltage strength of more than 4 mega Volts per cm.

FIG. 3A depicts an example process for fabricating a transistor such as depicted in FIG. 2B. Step 301 involves forming a body of a vertical channel transistor on a metal line on a dielectric layer on a substrate (see FIG. 3B for further details). Logic circuits may be provided between the substrate and the dielectric. For example, a silicon substrate may be provided, the logic circuits may be fabricated on the silicon substrate, and an oxide dielectric may be then be deposited. Step 302 involves oxidizing portions of the metal line which are adjacent to the body to raise the height of these portions by a controlled amount (see FIGS. 11A, 17 and 19B for further details). The oxidized portions of the metal line are metal oxide. Step 303 indicates that step 302 can result in oxidation of the body (see FIGS. 11A and 19B for further details). Step 304 involves removing the oxidized sidewall portions of the transistor body (see FIGS. 11A and 12A for further details). Step 305 involves depositing a gate insulator material (layer), e.g., oxide, on the body and on the metal oxide (see FIG. 13A for further details). Step 306 involves depositing a control gate material (layer), e.g., polysilicon, on the gate insulator material (see FIG. 13A for further details). Step 307 involves etching the control gate material and the gate insulator material down to the metal oxide, thus forming separate control gates from the control gate material (see FIG. 14A for further details). Step 308 involves replacing the metal oxide with insulation, e.g., oxide (see FIG. 16A for further details). Step 309 involves additional processing to form an array of memory cells (see FIG. 3C for further details).

Figure 8A:
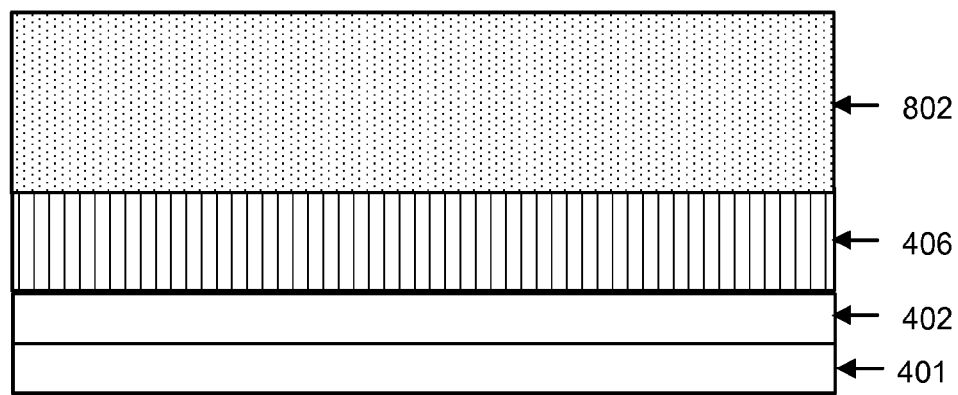
FIG. 8A depicts a cross-sectional view along line L2 of the semiconductor material 800 of FIG. 8B after depositing insulation 802.
Figure 8B:
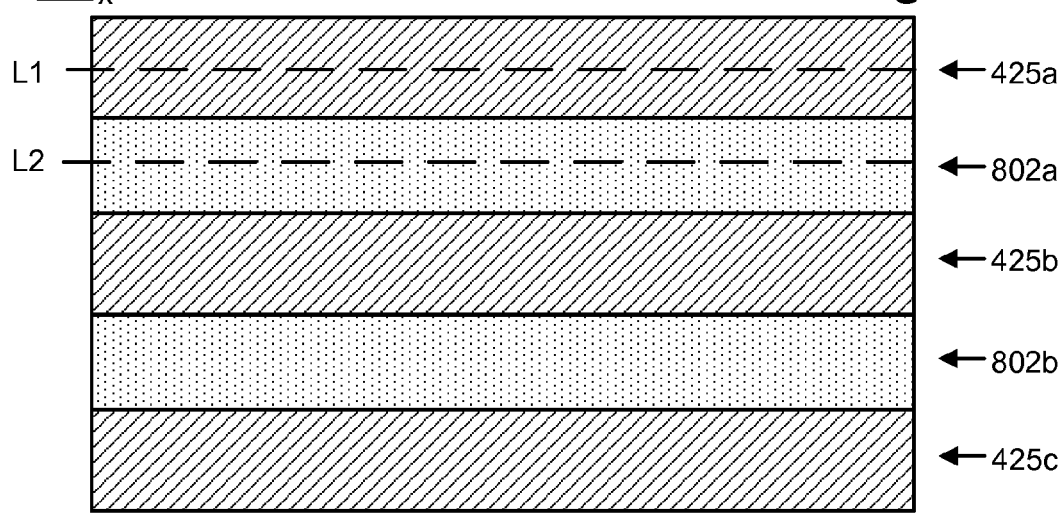
FIG. 8B depicts a top view of a semiconductor material 800, showing regions 802a and 802b of the insulation 802 which are deposited.

FIG. 3B depicts example steps for forming bodies of vertical channel transistors as set forth in step 301 of FIG. 3A. Different implementations are possible. One example implementation begins at step 310 and another begins at step 320. Step 310 involves forming metal conductive layers on a dielectric layer on a substrate. Step 311 involves etching to form a layer of metal lines. See example metal line 405 in FIG. 4A. The metal lines are formed with TiN as an adhesion layer, and W, followed by a gap filling process and chemical-mechanical planarization (CMP) before the polysilicon channel layers are deposited. FIG. 6B depicts etching which forms the metal lines below photoresist regions 430a, 430b and 430c, while gaps are formed in regions above insulation portions 406a and 406b, between the metal lines. FIGS. 8A and 8B depicts the gaps after they are filed with insulation 802. Excess insulation overfills the gaps and is removed using CMP so that the top view of FIG. 8B represents a planar surface.

The dielectric layer separates the metal lines from the substrate, which may be conductive.

Figure 4A:
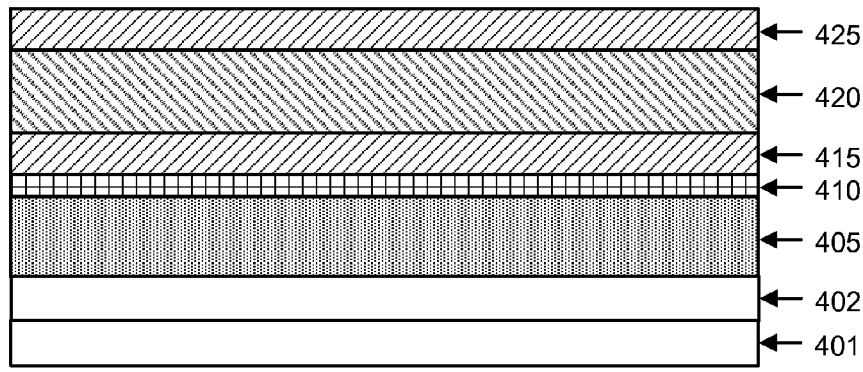

Step 312 involves depositing an adhesion layer (see layer 410 in FIG. 4A). Step 313 involves depositing a bottom, middle and top polysilicon layer (layers 415, 420 and 425, respectively, in FIG. 4A). Step 314 involves depositing a mask (see photoresist portions 901 and 902 in FIG. 9A). Step 315 involves etching the polysilicon layers and the adhesion layer, thus forming the bodies of the vertical channel transistors (see transistor bodies 1010 and 1020 in FIG. 10A). Step 315 also involves an option to etch part of the metal line in connection with the etching of the polysilicon layers (see metal line 405 in FIG. 18A which is partly etched, creating pedestals 1801 and 1802).

In another example implementation, an oxidation barrier can help to control the expansion of the metal line when it is oxidized. In this case, step 320 involves forming a first layer of metal on a dielectric layer on a substrate. Step 321 involves forming an oxidation barrier on the first layer of metal (see oxidation barrier 1950 in FIG. 19A). Step 322 involves forming a second layer of metal on the oxidation barrier (see second layer of metal 1916 in FIG. 19A). Step 323 involves etching to form first and second layers of metal lines on the oxidation barrier. The first and second layers of metal and the oxidation barrier are etched in one etch operation, for instance. For example, see first and second metal lines 1915 and 1916, respectively, in FIG. 19A. The process continues at steps 312-315 as discussed. In step 315, the option to etch part of the metal layer involves etching away part of the second metal line 1916 (not shown in FIG. 19A but analogous to metal line 405 in FIG. 18A).

Optionally, the etching of the polysilicon layers and the metal lines can be performed together using one mask. In this case, step 311 or 323 is combined with step 315.

FIG. 3C depicts example steps for carrying out the additional processing of step 309 of FIG. 3A. Step 331 involves depositing alternating dielectric and conductive layers in a stack (e.g., layers D0-D4 and WLL0-WLL3 in FIG. 2A). Step 332 involves etching holes in the stack. Step 333 involves depositing memory film/material in the holes (e.g., film 234 and 237 in FIG. 2A). Step 334 involves etching a hole through the bottom of the memory film, at the bottom of the hole in the stack. Step 335 involves depositing vertical bit line material in the holes in the stack and in the holes in the memory film so that the material contacts the top of each transistor body (e.g., VBL material 233 in FIG. 2A).

FIGS. 4A to 16C and 18A to 19C depict various stages of a semiconductor material in a fabrication process consistent with FIG. 3A.

Figure 4B:
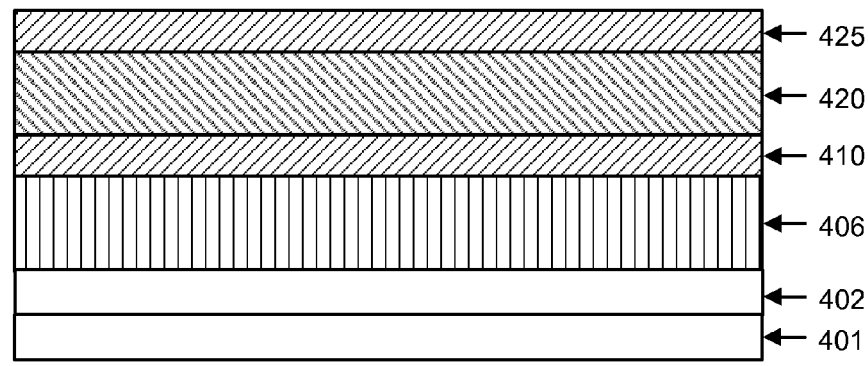
FIG. 4B depicts a cross-sectional view along line L2 of the semiconductor material 400 of FIG. 4C, in a region where transistors are not formed.
Figure 4C:
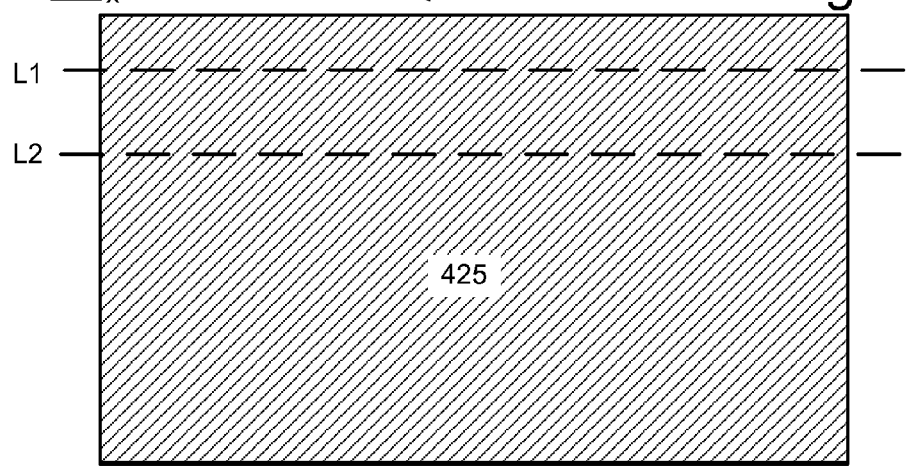
FIG. 4C depicts a top view of a semiconductor material 400.

FIG. 4A depicts a cross-sectional view along line L1 of the semiconductor material 400 of FIG. 4C, in a region where transistors are formed. A dielectric layer 402 such as oxide is deposited on a substrate 401. Additional layers include a metal layer, represented by a metal line 405, an adhesion layer 410, a lower polysilicon layer 415, a middle polysilicon layer 420 and an upper polysilicon layer 425.

FIG. 4B depicts a cross-sectional view along line L2 of the semiconductor material 400 of FIG. 4C, in a region where transistors are not formed. The layers are similar to those in FIG. 4A except an insulator 406 is provided in place of a metal line. In one approach, parallel and alternating lines of metal and insulation may extend in the x direction. This is indicated in FIG. 5B, for instance, where lines of photoresist are formed above the metal lines. However, other options are possible as well. For example, the parallel and alternating lines of metal and insulation may extend in a diagonal direction. Or, the metal and insulation may extend in paths which are not linear. For instance, the transistors may have a staggered arrangement.

FIG. 4C depicts a top view of a semiconductor material 400. The upper polysilicon layer 425 is visible. The line L1 extends along a path in which transistors are formed, while the line L2 extends along a path in which transistors are not formed, in this example implementation. Note the x-y axes here and the x-z axes in the prior two figures. The z axis denotes the vertical direction and the x and y axes denote horizontal directions.

Figure 5A:
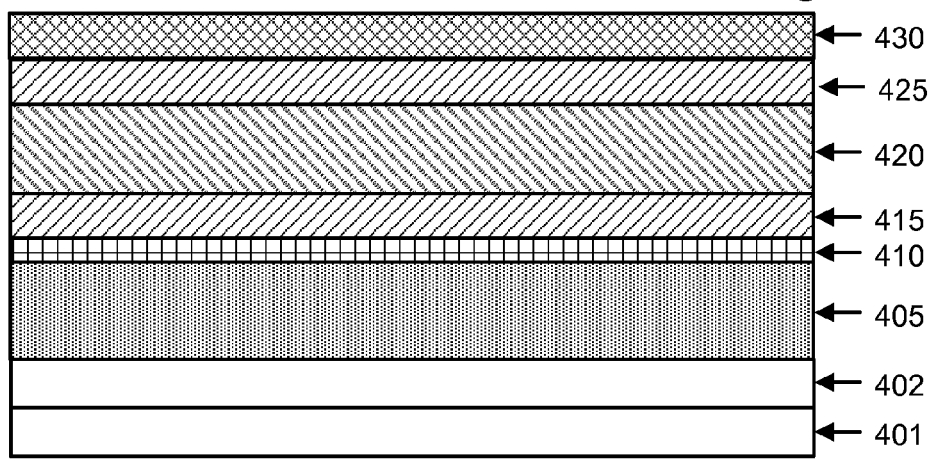
FIG. 5A depicts a cross-sectional view along line L1 of the semiconductor material 500 of FIG. 5B.
Figure 5B:
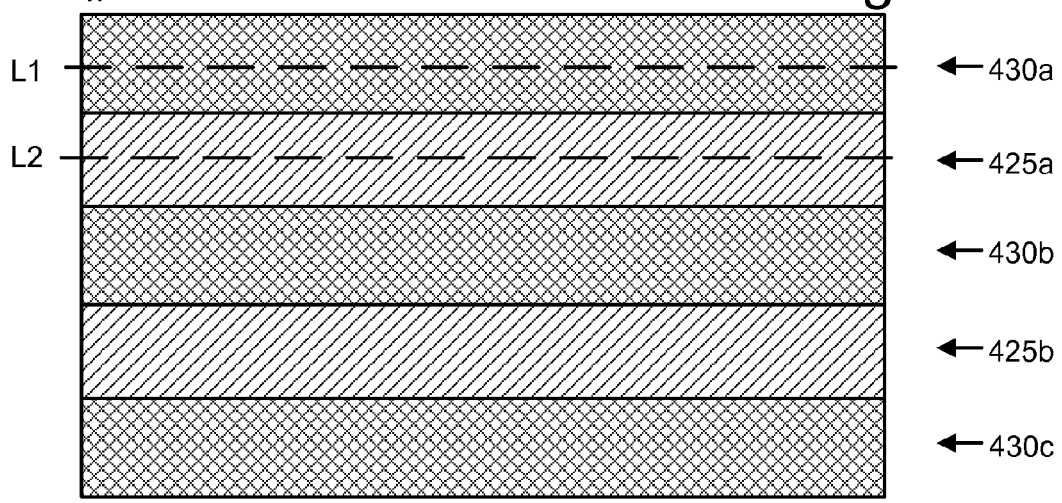
FIG. 5B depicts a top view of a semiconductor material 500, showing regions 430a, 430b and 430c of the photoresist layer 430 and regions 425a and 425b of the upper polysilicon layer 425.

FIG. 5A depicts a cross-sectional view along line L1 of the semiconductor material 500 of FIG. 5B. A mask comprising photoresist or hard mask 430 is formed on the upper polysilicon layer. For example, the photoresist may be patterned in parallel strips over the transistor regions as depicted in FIG. 5B. Another possible mask material is Advanced Patterning Film (APF) from Applied Materials Inc., Santa Clara, Calif. This mask is made of carbon.

The cross-sectional view along line L2 may be same as in FIG. 4B.

FIG. 5B depicts a top view of a semiconductor material 500, showing regions 430a, 430b and 430c of the photoresist layer 430 and regions 425a and 425b of the upper polysilicon layer 425.

Figure 6A:
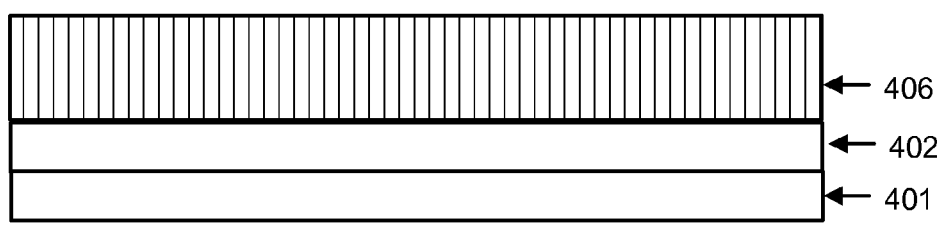
FIG. 6A depicts a cross-sectional view along line L2 of the semiconductor material 600 of FIG. 6B after etching portions of the lower polysilicon layer 415, the middle polysilicon layer 420 and the upper polysilicon layer 425 along paths represented by regions 425a and 425b in FIG. 5B.
Figure 6B:
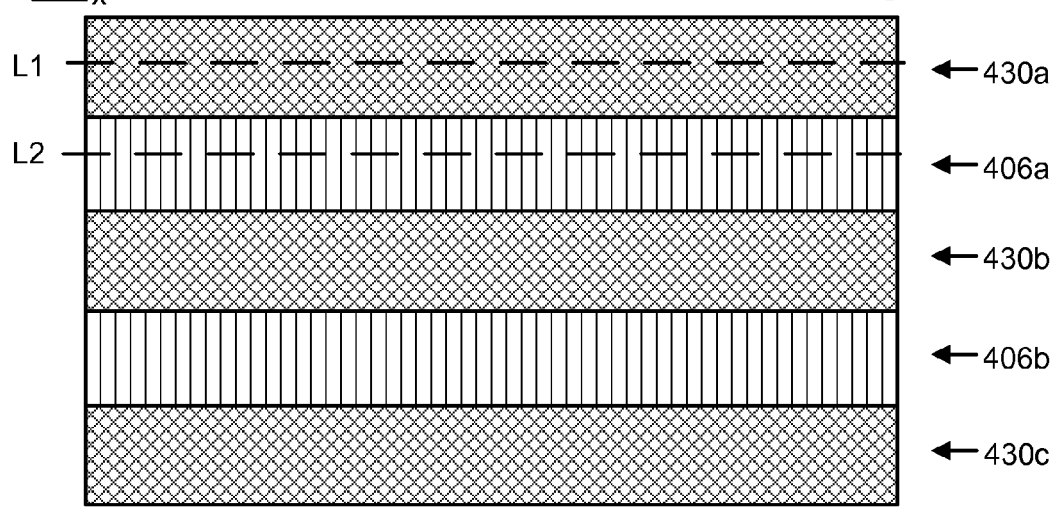
FIG. 6B depicts a top view of a semiconductor material 600, showing regions 406a and 406b of the insulation 406 of FIG. 6A which are exposed after the etching operation.

FIG. 6A depicts a cross-sectional view along line L2 of the semiconductor material 600 of FIG. 6B after etching portions of the lower polysilicon layer 415, the middle polysilicon layer 420 and the upper polysilicon layer 425 along paths represented by regions 425a and 425b in FIG. 5B. The semiconductor material is etched down to the insulation 406 in the regions in which the transistors are not located. The regions 430a, 430b and 430c of the photoresist layer prevent etching of the lower, middle and upper polysilicon layers in the regions in which the transistors will be located. As a result, the cross-sectional view along line L1 may be same as in FIG. 5A.

FIG. 6B depicts a top view of a semiconductor material 600, showing regions 406a and 406b of the insulation 406 of FIG. 6A which are exposed after the etching operation.

Figure 7A:
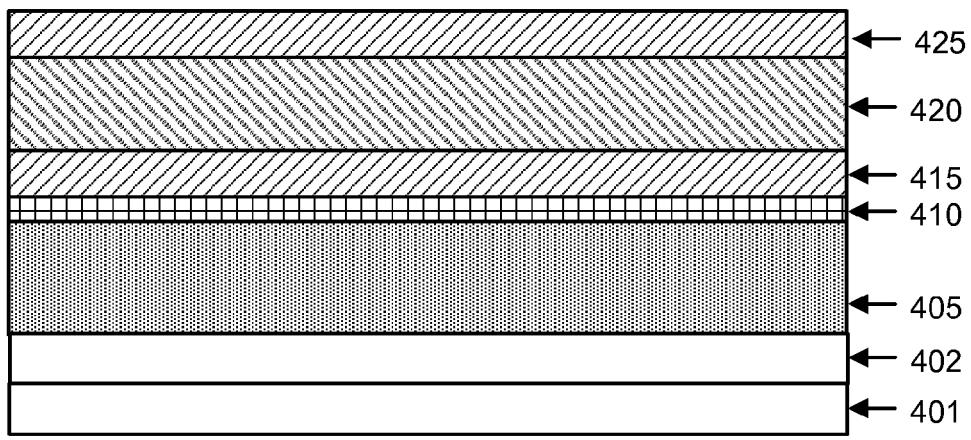
FIG. 7A depicts a cross-sectional view along line L1 of the semiconductor material 700 of FIG. 7B after removal of the photoresist layer 430.
Figure 7B:
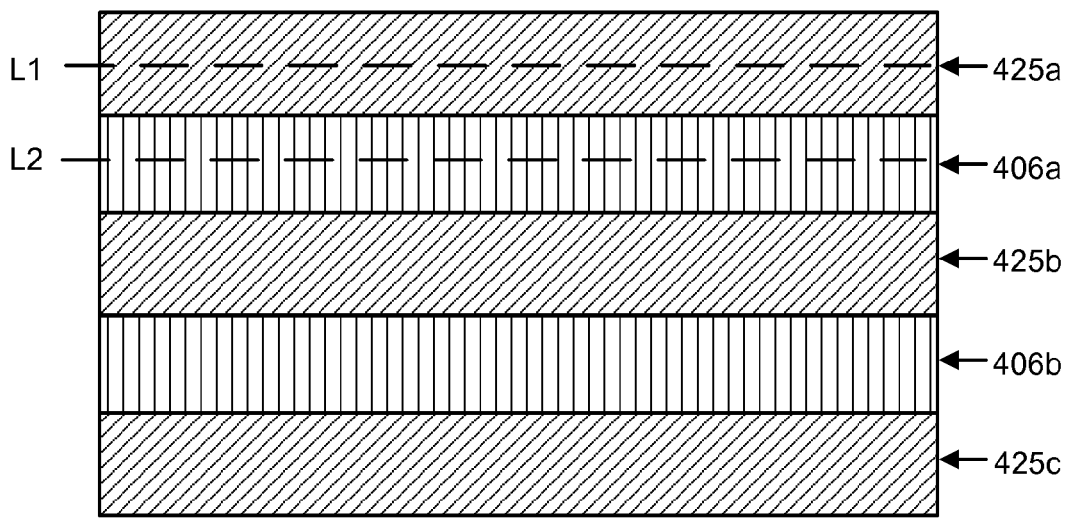
FIG. 7B depicts a top view of a semiconductor material 700, showing regions 425a, 425b and 425c of the upper polysilicon layer 425 which are exposed by removal of the regions 430a, 430b and 430c of the photoresist layer 430.

FIG. 7A depicts a cross-sectional view along line L1 of the semiconductor material 700 of FIG. 7B after removal of the photoresist layer 430. The upper polysilicon layer 425 is exposed.

The cross-sectional view along line L2 may be same as in FIG. 6A.

FIG. 7B depicts a top view of a semiconductor material 700, showing regions 425a, 425b and 425c of the upper polysilicon layer 425 which are exposed by removal of the regions 430a, 430b and 430c of the photoresist layer 430.

FIG. 8A depicts a cross-sectional view along line L2 of the semiconductor material 800 of FIG. 8B after depositing insulation 802 and performing CMP. The insulation is deposited in the regions in which the transistors are not formed.

The cross-sectional view along line L1 may be same as in FIG. 7A.

FIG. 8B depicts a top view of a semiconductor material 800, showing regions 802a and 802b of the insulation 802 which are deposited, after performing CMP.

Figure 9A:
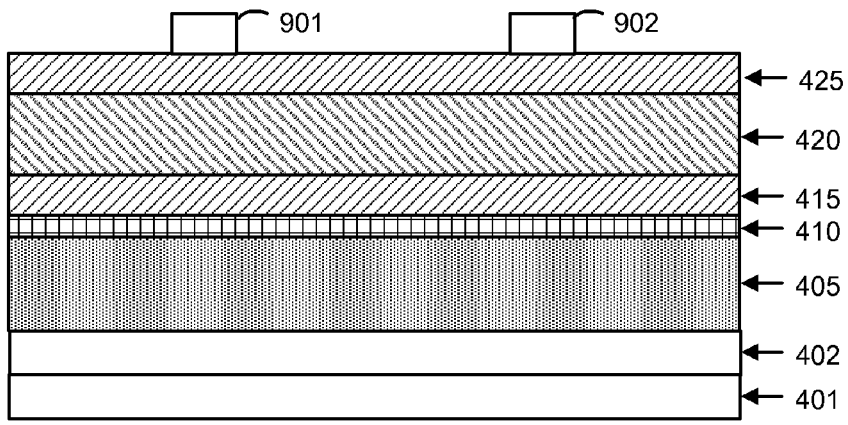
FIG. 9A depicts a cross-sectional view along line L1 of the semiconductor material 900 of FIG. 9C, where photoresist portions 901 and 902 are deposited.
Figure 9B:
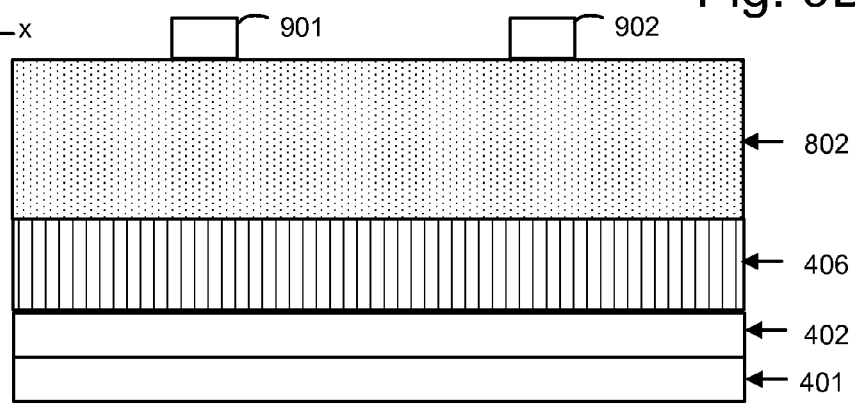
FIG. 9B depicts a cross-sectional view along line L2 of the semiconductor material 900 of FIG. 9C, where photoresist portions 901 and 902 are deposited.
Figure 9C:
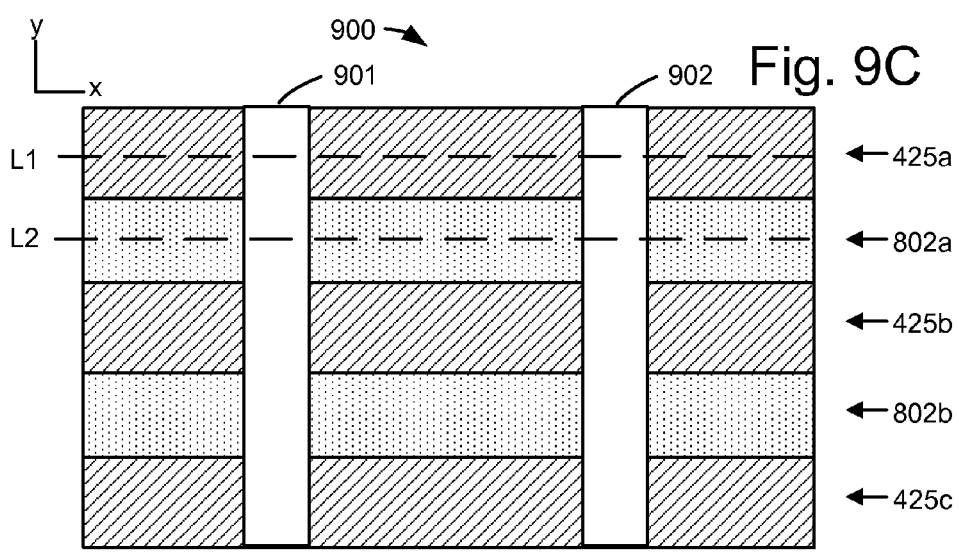
FIG. 9C depicts a top view of a semiconductor material 900, showing photoresist portions 901 and 902.

FIG. 9A depicts a cross-sectional view along line L1 of the semiconductor material 900 of FIG. 9C, where photoresist or hard mask portions 901 and 902 are deposited. The photoresist portions extend as lines in the y direction. The photoresist may be deposited as a blanket layer and patterned. The photoresist portions have a width in the x direction which is a desired width of the transistor bodies.

FIG. 9B depicts a cross-sectional view along line L2 of the semiconductor material 900 of FIG. 9C, where photoresist portions 901 and 902 are deposited.

FIG. 9C depicts a top view of a semiconductor material 900, showing photoresist portions 901 and 902.

Figure 10A:
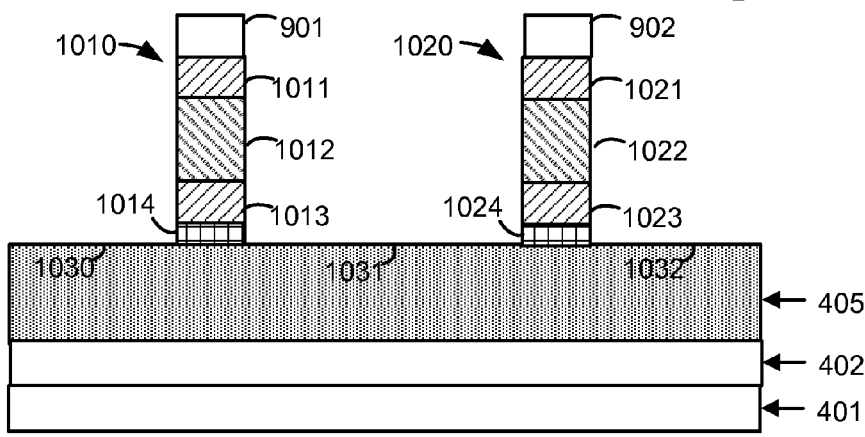
FIG. 10A depicts a cross-sectional view along line L1 of the semiconductor material 1000 of FIG. 10C, where the metal layer 405 is exposed after an etching operation consistent with step 315 of FIG. 3B.
Figure 10B:
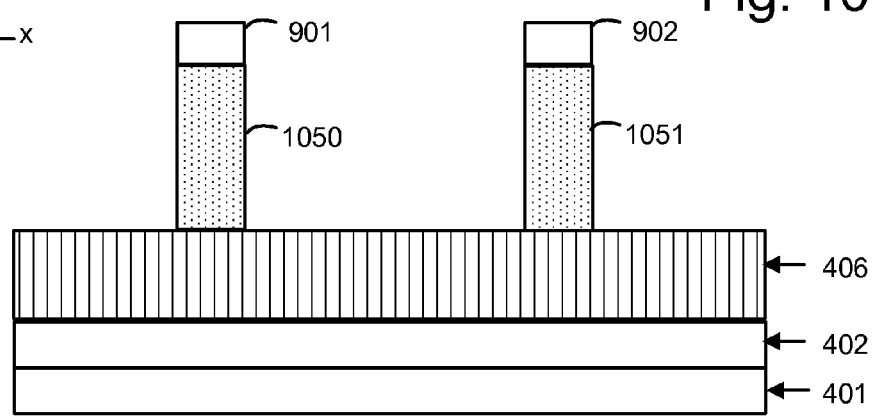
FIG. 10B depicts a cross-sectional view along line L2 of the semiconductor material 1000 of FIG. 10C, where the insulation 406 is exposed after the etching operation.
Figure 10C:
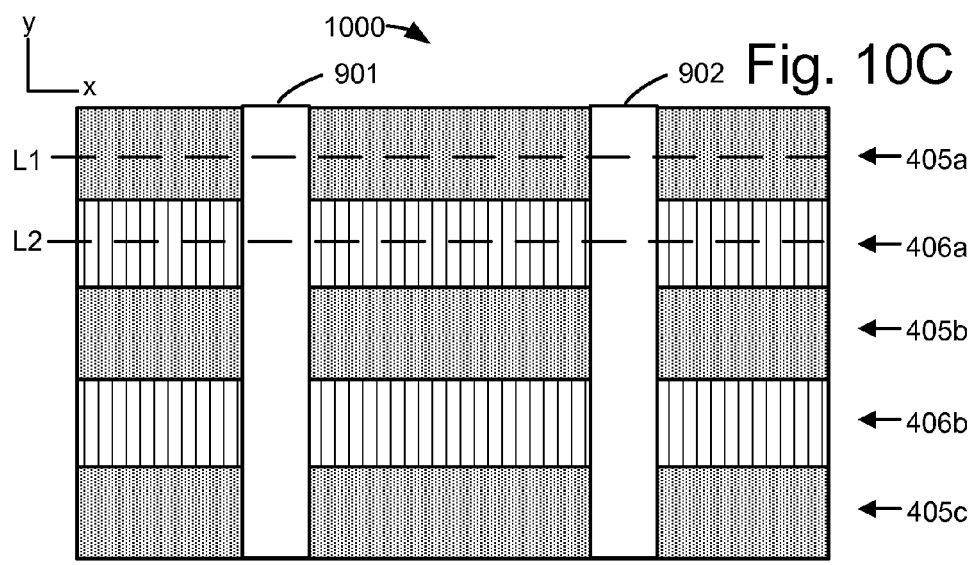
FIG. 10C depicts a top view of a semiconductor material 1000, showing photoresist portions 901 and 902, along with metal portions 405a, 405b and 405c and insulation portions 406a and 406b which are exposed after the etching operation.

FIG. 10A depicts a cross-sectional view along line L1 of the semiconductor material 1000 of FIG. 10C, where the metal layer 405 is exposed after an etching operation. The etching removes portions of the polysilicon layers and the adhesion layer. The etching forms transistor bodies 1010 and 1020 as polysilicon structures on adhesion layer portions 1014 and 1024. In one approach, the structures are pillars. The etching also exposes regions 1030, 1031 and 1032 of the metal line.

In this example, the metal line is not substantially etched. Optionally, the etching may remove part of the metal line which is adjacent to, but not directly under, the polysilicon structures, so that pedestals (which are directly under the polysilicon structures) are formed in the metal line by the etching. See, e.g., pedestals 1801 and 1802 in FIG. 18A. By concluding the etching process substantially at the surface of the metal line, the top of the metal oxide regions which are subsequently formed can be provided at the higher possible height. The ability to control the amount of etching of the metal line provides the ability to control the resulting height of the bottom of the control gate so that the control gate-to-drain overlap is optimized. Further, the metal line can be thinner when it is not etched.

The etching can be performed by controlling parameters such as etch time and by monitoring the etching depth so that the stopping point is at a desired height in the metal line. In practice, there will be some variations. Generally, it is desirable to ensure that the etching exposed the top surface of the metal so that the metal can be oxidized. As a result, a small amount of the top portion of the metal may be etched.

The body 1010 includes a source 1011, a middle portion 1012 and a drain 1013 on an adhesion layer region 1014. The body 1020 includes a source 1021, a middle portion 1022 and a drain 1023 on an adhesion layer region 1024. The mask portions 901 and 902 are removed before further processing occurs.

FIG. 10B depicts a cross-sectional view along line L2 of the semiconductor material 1000 of FIG. 10C, where the insulation 406 is exposed after the etching operation. Pillar shaped insulation structures 1050 and 1051 may be formed.

FIG. 10C depicts a top view of a semiconductor material 1000, showing photoresist portions 901 and 902, along with metal portions 405*a*, 405*b* and 405*c* and insulation portions 406*a* and 406*b* which are exposed after the etching operation.

Figure 11A:
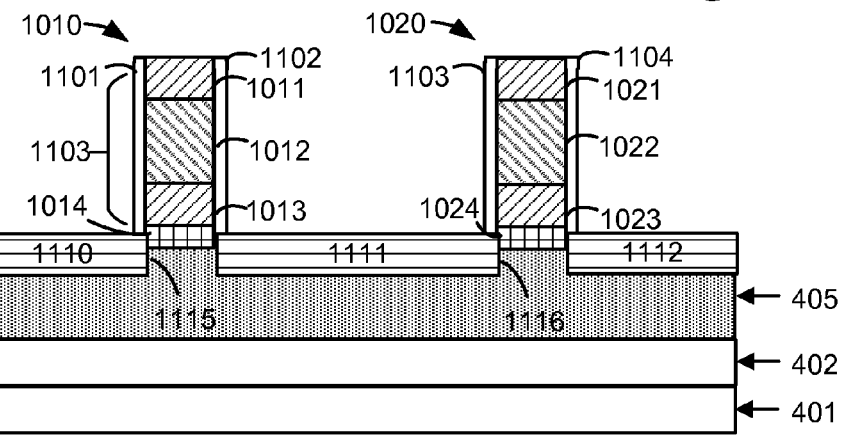
FIG. 11A depicts a cross-sectional view along line L1 of the semiconductor material 1100 of FIG. 11C, where metal oxide regions 1110, 1111 and 1112 are formed on the metal region 405.
Figure 11B:
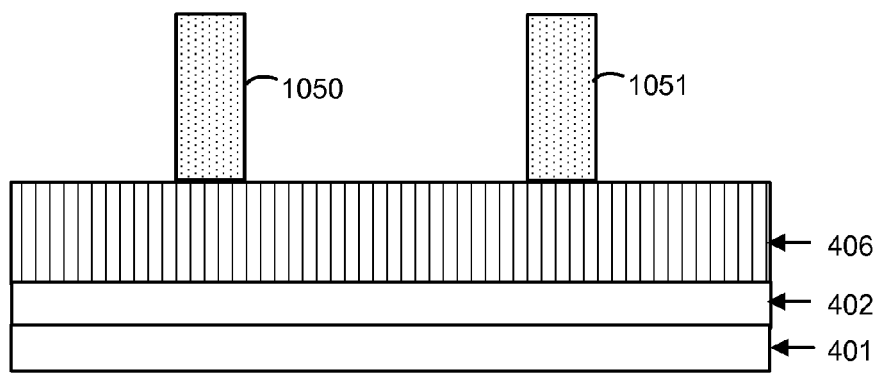
FIG. 11B depicts a cross-sectional view along line L2 of the semiconductor material 1100 of FIG. 11C, showing the insulation regions 1050 and 1051.
Figure 11C:
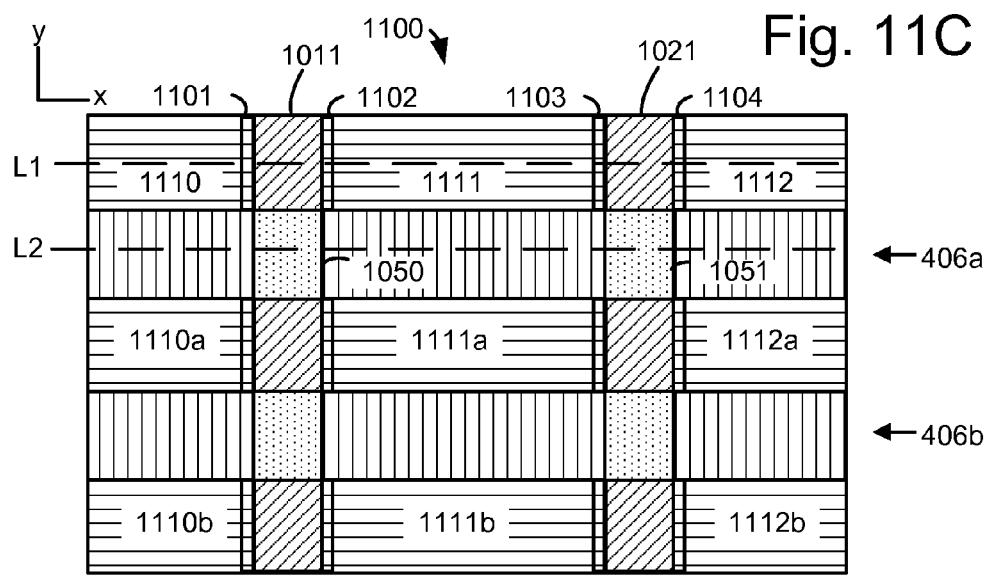
FIG. 11C depicts a top view of a semiconductor material 1100, showing metal oxide regions 1110, 1111 and 1112, 1110a, 1111a and 1112a and 1110b, 1111b and 1112b.

FIG. 11A depicts a cross-sectional view along line L1 of the semiconductor material 1100 of FIG. 11C, where metal oxide regions 1110, 1111 and 1112 are formed on the metal region 405. After the oxide regions are formed, the photoresist portions are removed. The oxide regions are formed by oxidizing the semiconductor material of FIG. 10C. The semiconductor material can be exposed to oxygen in a chamber. For example, in situ oxygen plasma ashing may be used. In this process, oxygen gas reacts with the metal line to form metal oxide regions 1110, 1111 and 1112. The oxidation regions have an expanded volume, as explained further in connection with FIG. 17, so that the top surface of the oxidized regions is higher than the top surface of the metal line before it is oxidized. This expansion allows a relatively thin gate insulator material to be deposited, where the thickness of the metal oxide regions and the gate insulator material together provide a surface at a desired height for forming the control gates with a desired gate-to-drain overlap. If the elevated metal oxide regions were not provided, the surface provided by the horizontal portion of the gate insulator material would be too low and would not provide the proper overlap. This surface could be elevated hypothetically by using a thicker gate insulator material, but this would result in the control gate being spaced too far from the transistor body, interfering with the ability of the control gate to control the current flow in the transistor body. Another possible approach is to provide a blanket deposition of an insulation on the metal layer, and then deposit the gate insulator material and the control gate material. However, the blanket deposition would cover the transistor body and would have to be removed without damaging the transistor body. This is problematic. Another possible approach etches down an insulation layer to a desired height. However, this requires a very high etching uniformity, which is problematic.

The metal oxide extends downward in the metal line such that pedestals 1115 and 1116 of the metal line are formed.

The oxygen may also react with the polysilicon body of the transistors to form oxide layers 1101 and 1102 on the transistor body 1010, and oxide layers 1103 and 1104 on the transistor body 1020. These oxide layers (e.g., SiO2) are formed on the sidewalls of the transistor bodies (see example sidewall 1103). The oxide layers may be removed in a cleaning process such as by using dilute hydrofluoric (dHF) acid. dHF is suitable for removing the oxide layers without removing substantial amounts of the metal oxide. That is, the cleaning process is selective to the oxidized regions of the polysilicon structures but not to the metal oxide regions.

FIG. 11B depicts a cross-sectional view along line L2 of the semiconductor material 1100 of FIG. 11C, showing the insulation regions 1050 and 1051.

FIG. 11C depicts a top view of a semiconductor material 1100, showing metal oxide regions 1110, 1111 and 1112, 1110*a*, 1111*a* and 1112*a* and 1110*b*, 1111*b* and 1112*b*. The sidewall oxide layers (e.g., 1101-1104) of FIG. 11A and other sidewall oxide layers from other transistor regions are also depicted.

Figure 12A:
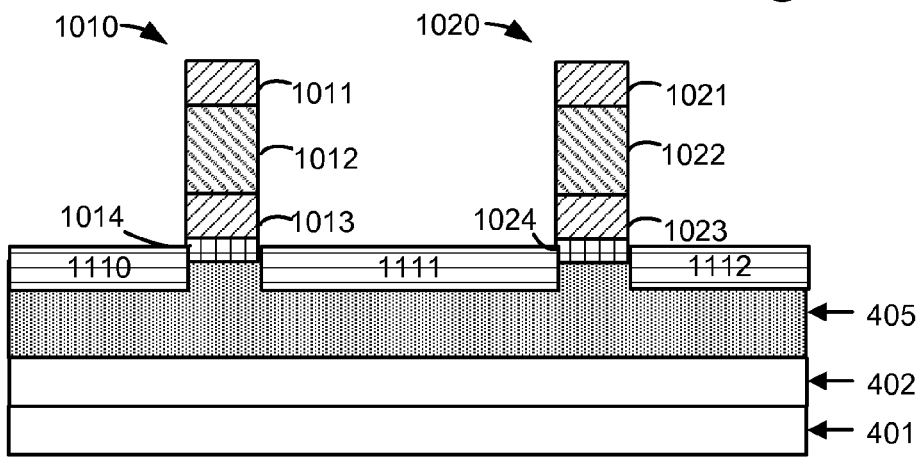
FIG. 12A depicts a cross-sectional view along line L1 of the semiconductor material 1200 of FIG. 12B after removal of the sidewall oxide regions 1101, 1102, 1103 and 1104.
Figure 12B:
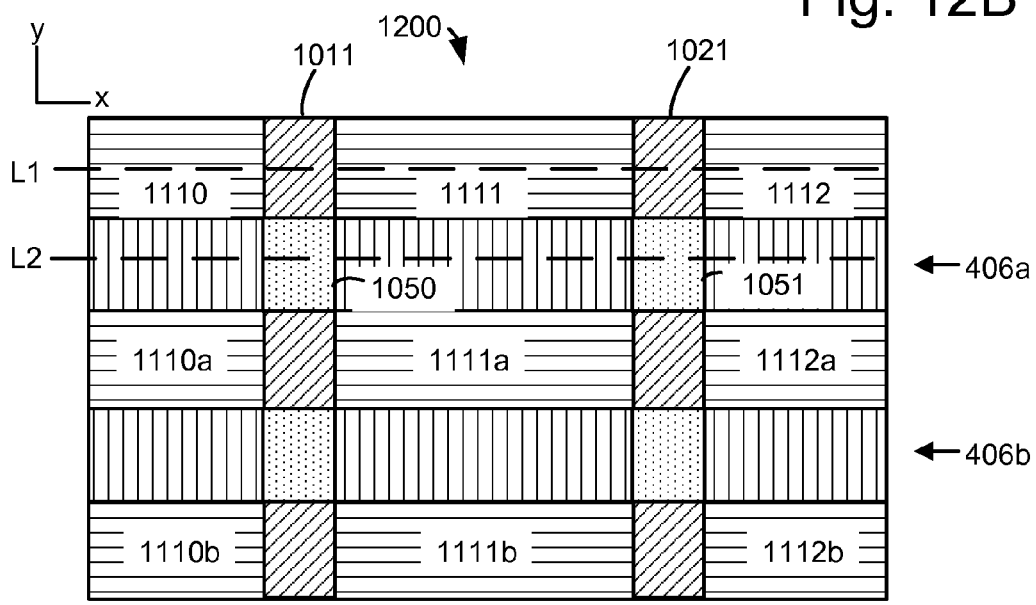
FIG. 12B depicts a top view of a semiconductor material 1200, after removal of the sidewall oxide regions 1101-1104.

FIG. 12A depicts a cross-sectional view along line L1 of the semiconductor material 1200 of FIG. 12B after removal of the sidewall oxide regions 1101, 1102, 1103 and 1104. See the discussion of FIG. 11A.

The cross-sectional view along line L2 may be same as in FIG. 11B.

FIG. 12B depicts a top view of a semiconductor material 1200, after removal of the sidewall oxide regions 1101-1104.

Figure 13A:
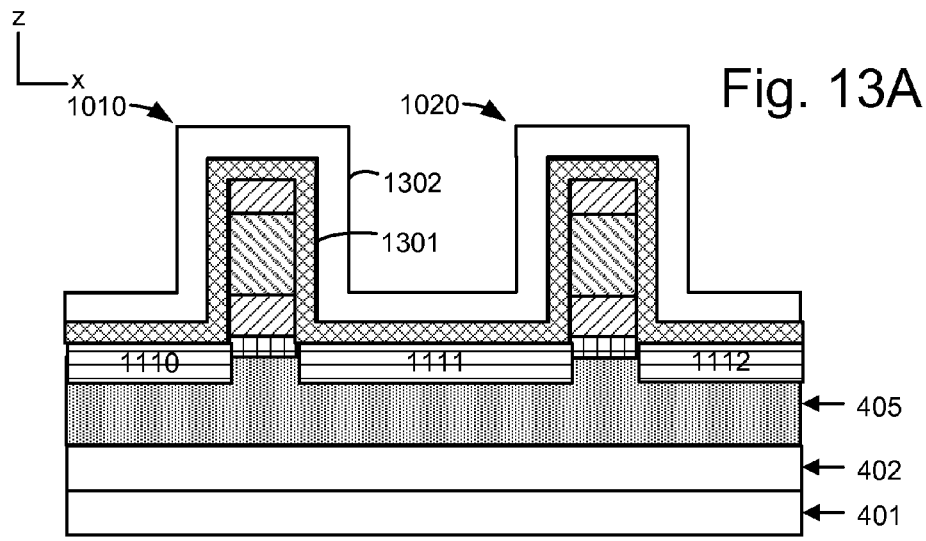
FIG. 13A depicts a cross-sectional view along line L1 of the semiconductor material 1300 of FIG. 13C, where a gate insulator material 1301 and a control gate material 1302 are deposited.
Figure 13B:
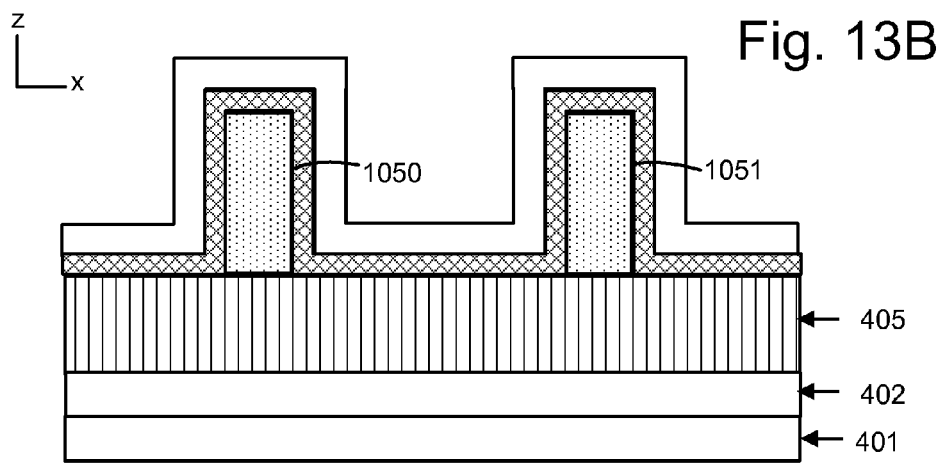
FIG. 13B depicts a cross-sectional view along line L2 of the semiconductor material 1300 of FIG. 13C, where the gate insulator material and the control gate material are deposited.
Figure 13C:
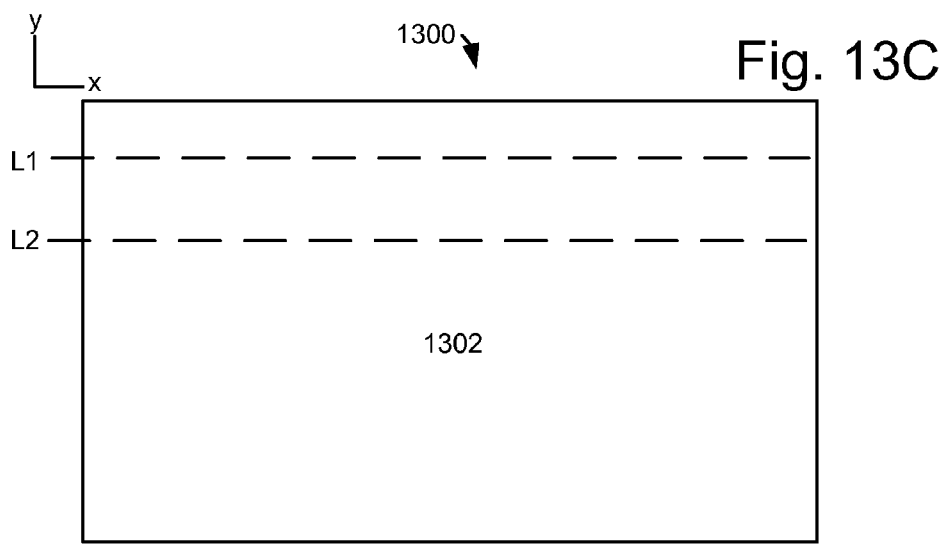
FIG. 13C depicts a top view of a semiconductor material 1300, showing a control gate material 1302.

FIG. 13A depicts a cross-sectional view along line L1 of the semiconductor material 1300 of FIG. 13C, where a gate insulator material 1301 and a control gate material 1302 are deposited. For instance, the gate insulator material can be oxide and the control gate material can be polysilicon. The gate insulator material has a thickness which controls the spacing between the control gate and the transistor body. The control gate material is used to provide control gates for the transistors. The gate insulator material and the control gate material may be provided in a blanket deposition as depicted in FIG. 13C.

FIG. 13B depicts a cross-sectional view along line L2 of the semiconductor material 1300 of FIG. 13C, where the gate insulator material and the control gate material are deposited.

FIG. 13C depicts a top view of a semiconductor material 1300, showing a control gate material 1302.

FIG. 14A depicts a cross-sectional view along line L1 of the semiconductor material 1400 of FIG. 14C, following an etching operation. The semiconductor material 1300 is etched. The etching serves to separate portions of the control gate material to provide separate transistors with respective control gates. The etching also exposes top surfaces 1430, 1431 and 1432 of the metal oxide regions 1110, 1111 and 1112, respectively, so that these metal oxide regions can be removed. In this example, transistors 1410 and 1420 are formed. The etching can include the polysilicon layers, the adhesion layer and optionally part of the metal oxide. The etching can forms rows of transistors, as discussed. The transistor 1410 includes vertical gate insulator portions 1411 and 1412 and horizontal gate insulator portions 1415 and 1416, and control gates 1413 and 1414. Similarly, the transistor 1420 includes vertical gate insulator portion 1421 and 1422, horizontal gate insulator portions 1425 and 1426, and control gates 1423 and 1424.

FIG. 14B depicts a cross-sectional view along line L2 of the semiconductor material 1400 of FIG. 14C, following the etching operation. The control gates 1413, 1414, 1423 and 1424 are depicted as being rail-shaped and extending in the y direction. The vertical gate insulator portions 1411, 1412, 1421 and 1422 are also depicted as being rail-shaped and extending in the y direction.

FIG. 14C depicts a top view of a semiconductor material 1400, following the etching operation. Transistors are not formed from the insulation regions 1050 and 1051.

Figure 15A:
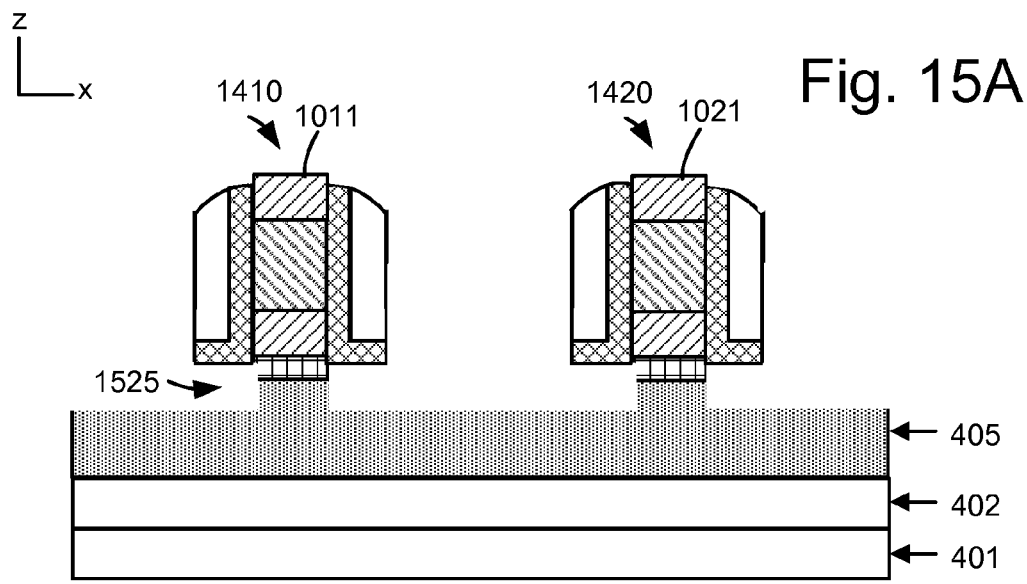
FIG. 15A depicts a cross-sectional view along line L1 of the semiconductor material 1500 of FIG. 15B, following the removal of the metal oxide consistent with step 308 of FIG. 3A.
Figure 15B:
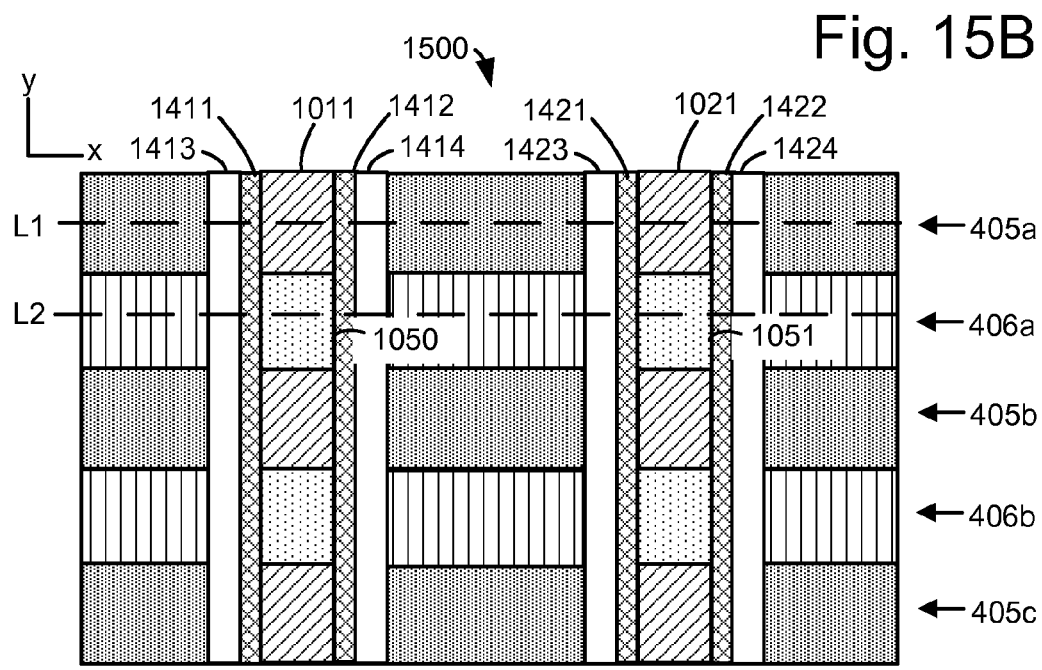
FIG. 15B depicts a top view of a semiconductor material 1500, following the etching operation, following the removal of the metal oxide.

FIG. 15A depicts a cross-sectional view along line L1 of the semiconductor material 1500 of FIG. 15B, following the removal of the metal oxide. The metal oxide can be removed by etching using hot TMY (trimethyl-2-hydroxyethylammonium hydroxide, a choline aqueous solution) without dilute hydrofluoric acid, for instance. This etching away forms voids directly under the control gates, such as the example void 1525. This etching process is selective to the metal oxide.

FIG. 15B depicts a top view of a semiconductor material 1500, following the etching operation, following the removal of the metal oxide. The metal regions 405a, 405b and 405c are exposed when the metal oxide is removed.

Figure 16A:
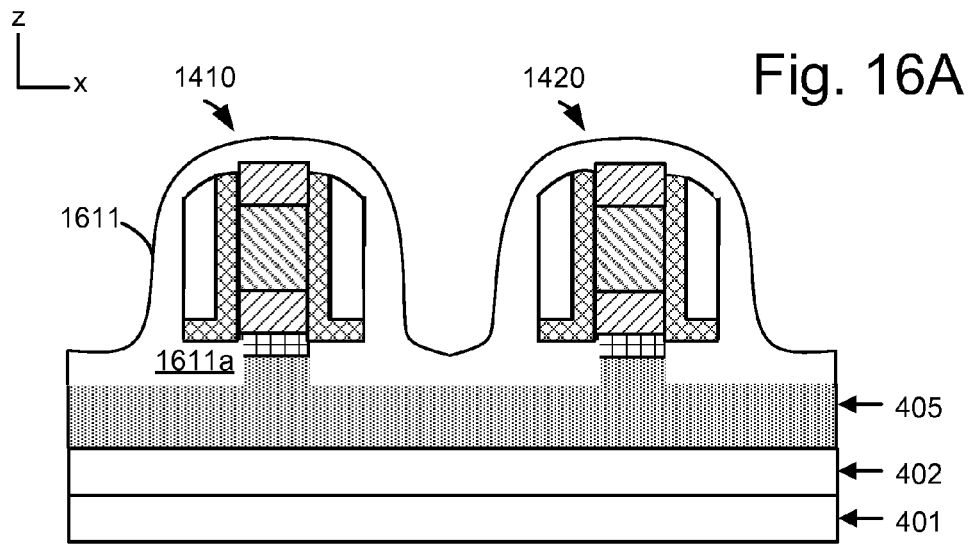
FIG. 16A depicts a cross-sectional view along line L1 of the semiconductor material 1600 of FIG. 16C, following a deposition of insulation consistent with step 308 of FIG. 3A.
Figure 16B:
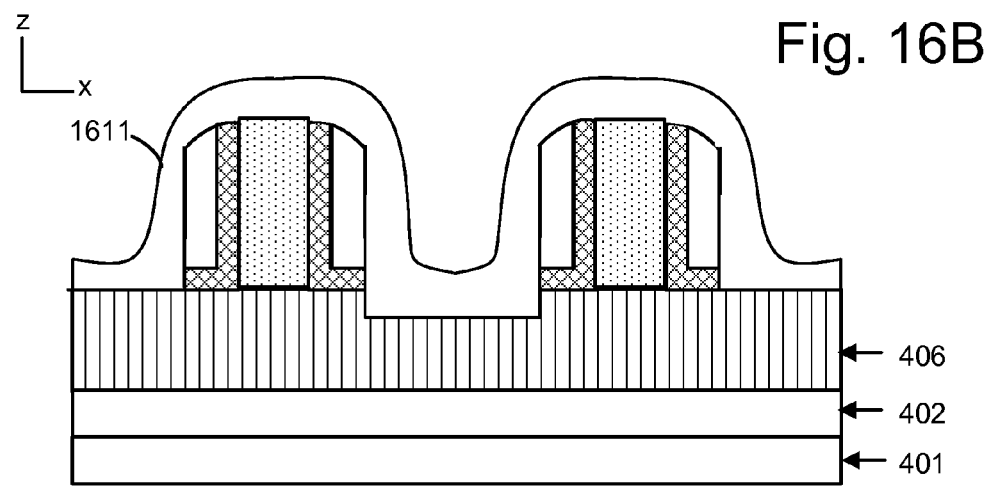
FIG. 16B depicts a cross-sectional view along line L2 of the semiconductor material 1600 of FIG. 16C, following the deposition of insulation.
Figure 16C:
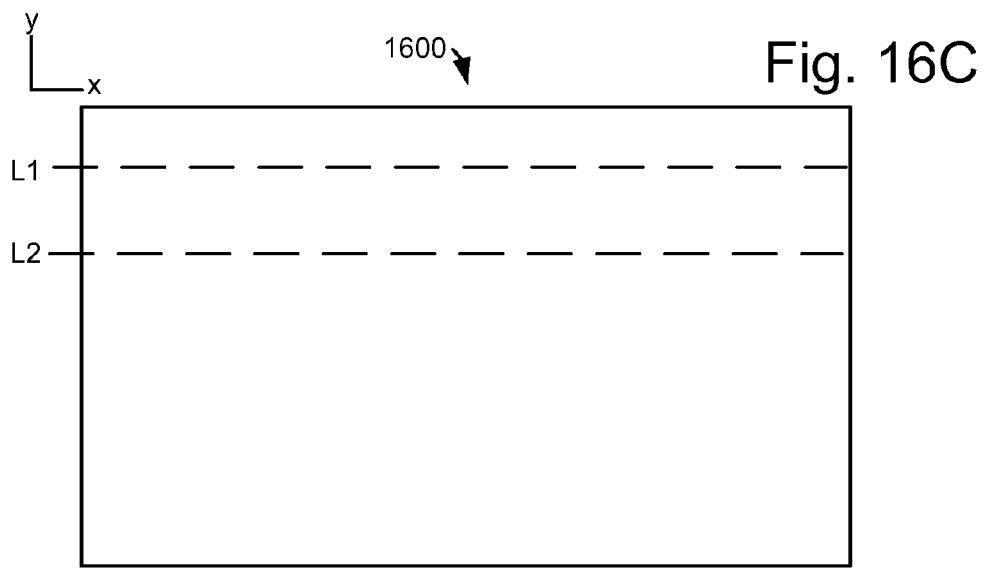

FIG. 16A depicts a cross-sectional view along line L1 of the semiconductor material 1600 of FIG. 16C, following a deposition of insulation such as oxide. The insulation 1611 fills voids created by the removal of the metal oxide, and may be deposited by atomic layer deposition, for example. A portion (such as example portion 1611a) of the insulation material fills the voids directly under the control gate. Other portions of the insulation material cover the sides and tops of the transistors. The portion of the insulation material which fills the voids has a thickness or height which is set by the thickness of the metal oxide. This thickness can be advantageously set separately from the thickness of the gate insulator material to provide good isolation of the control gate from the metal line and an optimal gate-to-drain overlap.

Additional processing can include removing a portion of the insulation material which is above the body to allow the bottom of the vertical bit line to contact the top of the body, such as depicted in FIG. 2A.

FIG. 16B depicts a cross-sectional view along line L2 of the semiconductor material 1600 of FIG. 16C, following the deposition of insulation.

FIG. 16C depicts a top view of a semiconductor material 1600, showing a layer of insulation in a blanket deposition.

Figure 17:
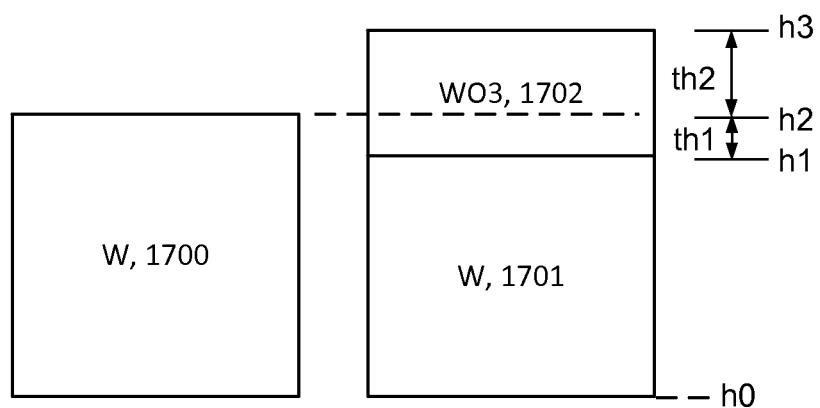
FIG. 17 depicts metal oxide which is formed by oxidizing a metal line.

FIG. 17 depicts metal oxide which is formed by oxidizing a metal line, consistent with the metal oxide regions 1110-1112 of FIG. 11A. As mentioned, a metal oxide has an expanded volume, relative to a non-oxidized metal. In an example implementation, a portion of a non-oxidized metal line made of tungsten (W) 1700 is oxidized, resulting in a non-oxidized portion 1701 of the metal line and an oxidized portion 1702 (e.g., tungsten oxide, WO3) of the metal line. One portion of the metal oxide having a thickness th1 is located where the non-oxidized metal line was originally located, and another portion of the metal oxide having a thickness th2 is located above the original top surface (h2) of the non-oxidized metal line.

Specifically, the oxidized region includes a first portion of thickness th1 and a second portion of thickness th2, for a total thickness of Total_th=th1+th2. The first portion extends from h1-h2 below the original surface of the metal line and the second portion extends from h2-h3 above the surface of the metal line. Generally, the thickness of the oxidized region will be a function of density and atomic or molecular weight. For example, assume a region of W of thickness th1 is oxidized to become a region of WO3 with thickness Total_th. W has an atomic weight of 183.84 and a density of 19.25 g/cm3. An oxygen atom has an atomic weight of 16, so a molecule of O3 has a molecular weight of 48. WO3 therefore has a molecular weight of 183.84+48=231.84. WO3 has a density of 7.16 g/cm3. We have: Total_th=th1×[density/(W)/density (WO3)]×[weight(WO3)/weight (W)]=th1×3.39. The oxidation process can be controlled so that the top of the oxidized region is at a desired level (h3) above the surface (h2) of the original non-oxidized metal line. For example, parameters such as oxidation time, temperature, and the density and pressure of the oxidizing gas, can be controlled. The surface of the metal oxide serves as a base for the gate insulator material, and the gate insulator material serves as a base for the control gate material.

Figure 18A:
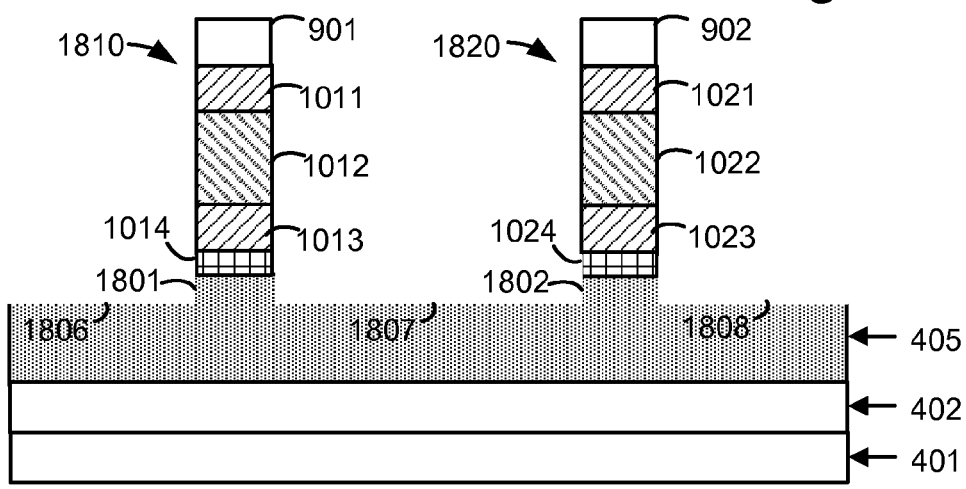

FIG. 18A depicts an alternative cross-sectional view along line L1 of the semiconductor material 1000 of FIG. 10C, where a portion of the metal layer 405 is etched. As mentioned, the etching operation which separates the transistor bodies can extend down to and include a portion of the metal lines. The etching may remove part of the metal line which is adjacent to, but not directly under, the polysilicon structures, so that pedestals 1801 and 1802 are formed in the metal line directly under the transistor bodies 1810 and 1820. By etching a part of the metal lines by a controlled amount, a resulting height of the control gate relative to the transistor body can be set. The etching exposes regions 1806, 1807 and 1808 of the metal oxide. The remaining processing occurs as discussed previously.

Figure 18B:
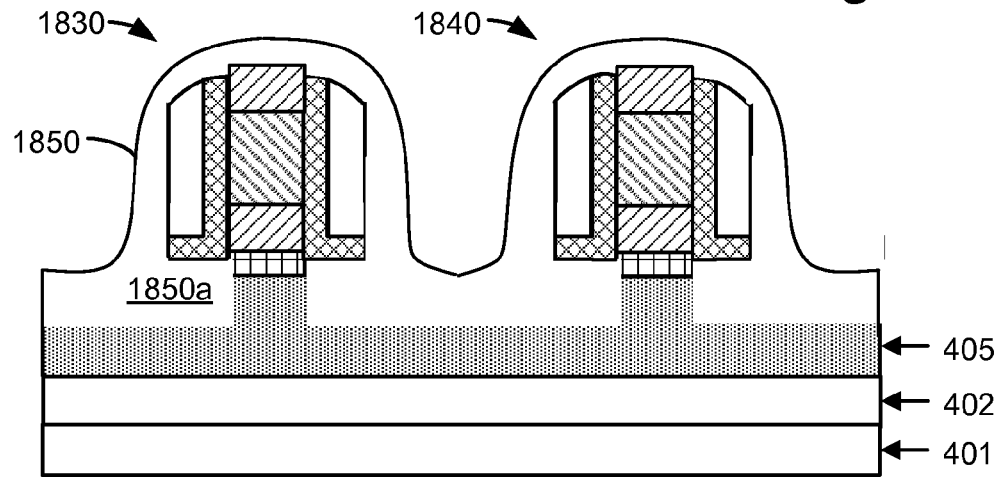
FIG. 18B depicts a final configuration of transistors 1830 and 1840 consistent with FIG. 18A.

FIG. 18B depicts a final configuration of transistors 1830 and 1840 consistent with FIG. 18A after insulation 1850 is deposited. The insulation fills voids created by the removal of the metal oxide. A portion (such as example portion 1850a) of the insulation material fills the voids directly under the control gate.

Figure 19A:
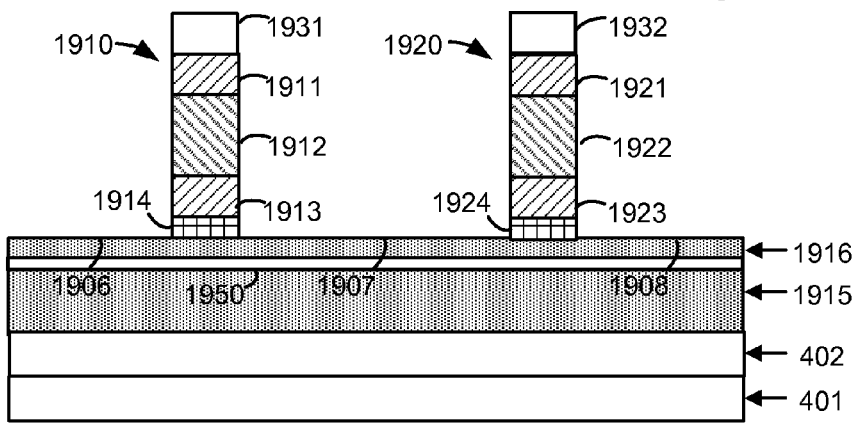
FIG. 19A depicts an alternative cross-sectional view along line L1 of the semiconductor material 1000 of FIG. 10C, where an oxidation barrier 1950 is provided.

FIG. 19A depicts an alternative cross-sectional view along line L1 of the semiconductor material 1000 of FIG. 10C, where an oxidation barrier 1950 is provided. The oxidation barrier limits the depth of the metal oxide formation in the metal line, and can result in a more consistent height for the metal oxide regions. A first metal line 1915 is formed on the dielectric layer 402 on the substrate 401. An oxidation barrier 1950 such as titanium nitride (TiN2) is formed on the first metal line. A second metal line 1916 is formed on the oxidation barrier. An adhesion layer and lower, middle and upper polysilicon layers are then formed. After etching down to the top of the second metal line, first and transistor bodies 1910 and 1920 are formed, and include adhesion layer portions 1914 and 1924, lower polysilicon layers 1913 and 1923, middle polysilicon layers 1912 and 1922, and top polysilicon layers 1911 and 1921, respectively. Mask portions 1931 and 1932 are present on the transistor bodies after etching but are later removed. Regions 1906, 1907 and 1908 of the second metal line 1916 are exposed.

Figure 19B:
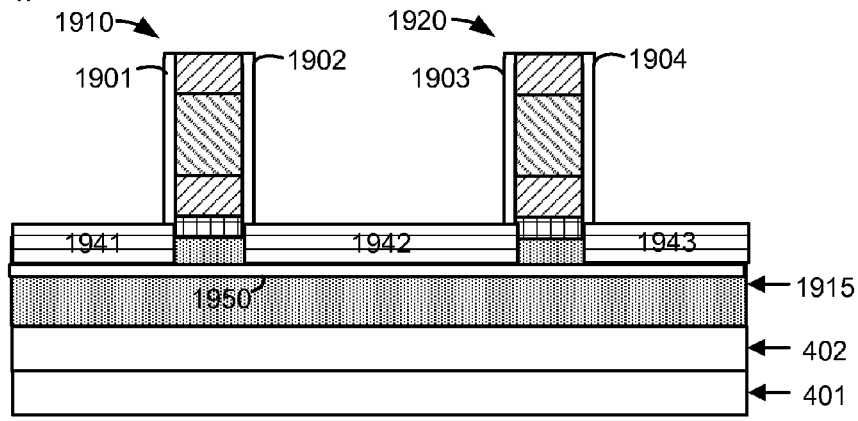
FIG. 19B depicts metal oxide regions 1941, 1942 and 1943 formed on the second metal line 1916 of FIG. 19A.

FIG. 19B depicts metal oxide regions 1941, 1942 and 1943 formed on the second metal line 1916 of FIG. 19A. The semiconductor material can be exposed to oxygen in a chamber. The oxygen reacts with the second metal line to form the metal oxide regions. The metal oxide regions have an expanded volume, as discussed, so that the top surface of the metal oxide regions is higher than the top surface of the metal line before it is oxidized. Moreover, the oxidation barrier 1950 limits the downward extent of the metal oxide regions. The oxygen may also react with the body of the transistor to form oxide layers 1901, 1902, 1903 and 1904 (e.g., SiO2) on the sidewalls of the transistor bodies. These oxide layers may be removed in a cleaning process, as discussed.

Figure 19C:
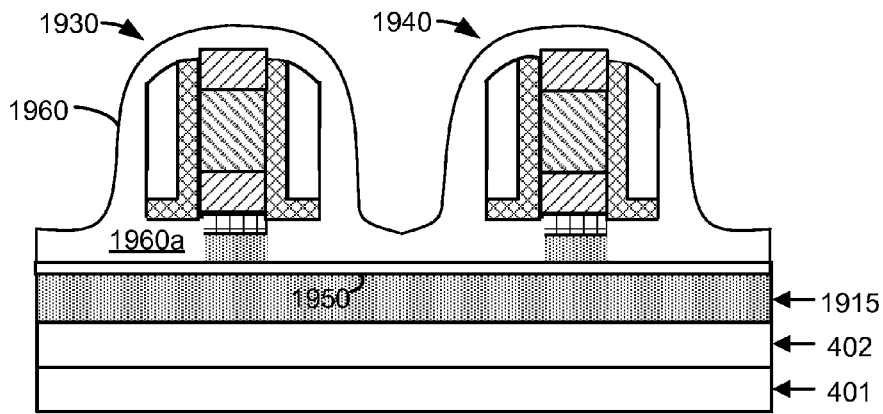

FIG. 19C depicts a final configuration of transistors 1930 and 1940 consistent with FIGS. 19A and 19B. An insulation 1960 fills voids created by the removal of the metal oxide. A portion (such as example portion 1960a) of the insulation material fills the voids directly under the control gate.

Accordingly, it can be seen that, in one embodiment, a method for fabricating a semiconductor device comprises: etching a layered semiconductor material, the layered semiconductor material comprising polysilicon layers above a metal line, the etching etches through the polysilicon layers and down to the metal line, forming polysilicon structures from the polysilicon layers and exposing regions of the metal line, each polysilicon structure is a body of a vertical channel transistor; oxidizing the regions of the metal line to provide metal oxide regions; after the oxidizing, depositing a gate insulator material followed by depositing a control gate material; etching through the control gate material and the gate insulator material and down to the metal oxide regions, the etching through forms control gates of the vertical channel transistors from the control gate material and gate insulators between the polysilicon structures and the control gates from the gate insulator material; etching away the metal oxide regions, the etching away forms voids directly under the control gates; and depositing an insulation material, a portion of the insulation material fills the voids.

In another embodiment, a method for fabricating a semiconductor device comprises: forming a body of a vertical channel transistor above a metal line, the body of the vertical channel transistor and the metal line are carried on a substrate; forming metal oxide regions extending upward from the metal line; depositing a gate insulator material; depositing a control gate material on the gate insulator material, the control gate material provides a control gate of the vertical channel transistor, and the gate insulator material provides a spacer between the control gate and the body; and replacing the metal oxide regions with an insulation to cause a bottom portion of the control gate material to be separated from the metal line by the gate insulator material and the insulation.

In the above examples in which gap filling and CMP is used, a stopper layer may optionally be used to limit the CMP process.

Further, the use of a photoresist or a hard mask has been mentioned for patterning underlying layers. Generally, photoresist is sufficient when the half pitch dimensions of the memory device are larger, e.g., about 42 nm or more, while a hard mask is more appropriate when the half pitch dimensions of the memory device are smaller, e.g., about 30 nm or less.

In another embodiment, a method for fabricating a semiconductor device comprises: etching a layered semiconductor material, the layered semiconductor material comprising polysilicon layers above a metal line, the etching etches through the polysilicon layers and a portion of the metal line, forming polysilicon structures from the polysilicon layers, forming pedestal regions in the metal line and exposing regions of the metal line, each polysilicon structure is a body of a vertical channel transistor; oxidizing regions of the metal line to provide metal oxide regions; after the oxidizing, depositing a gate insulator material followed by depositing a control gate material; etching through the control gate material and the gate insulator material down to the metal oxide regions, the etching through forms control gates of the vertical channel transistors from the control gate material, and the etching through forms gate insulators between the polysilicon structures and the control gates from the gate insulator material; etching away the metal oxide regions, the etching away forms voids directly under the control gates; and depositing an insulation, a portion of the insulation fills the voids.

In another embodiment, a semiconductor device comprises: a metal line comprising a higher, pedestal region and a lower, non-pedestal region; a body of a vertical channel transistor on the pedestal; a gate insulator of the vertical channel transistor, the gate insulator comprising a vertical portion and a horizontal portion; a control gate adjacent to, and lateral of, the vertical portion and the gate insulator, and adjacent to, and above, the horizontal portion of the gate insulator; and insulation between the horizontal portion of the gate insulator and the lower, non-pedestal region of the metal line.

In further aspects, the lower, non-pedestal region is adjacent to the higher, pedestal region on one side of the higher, pedestal region; and the metal line comprises another lower, non-pedestal region adjacent to the higher, pedestal region on one side of the higher, pedestal region.

An adhesion layer is on the pedestal region, between the body and the pedestal region. The body comprises a source region on a middle region on a drain region. The gate insulator material comprises oxide. The control gate material comprises polysilicon. The semiconductor device is in a three-dimensional memory array; the metal line comprises a global bit line; and a vertical bit line is adjacent to a top of the body. The body is pillar shaped. Also, a distance between a bottom of the control gate and a top of the lower, non-pedestal region is based on a height of the insulation and a height of the higher, pedestal region above the lower, non-pedestal region.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A method for fabricating a semiconductor device, comprising:
   etching a layered semiconductor material, the layered semiconductor material comprising polysilicon layers above a metal line, the etching etches through the polysilicon layers and down to the metal line, forming polysilicon structures from the polysilicon layers and exposing regions of the metal line, each of the polysilicon structures is a body of a vertical channel transistor;
   oxidizing the regions of the metal line to provide metal oxide regions;
   after the oxidizing, depositing a gate insulator material followed by depositing a control gate material;

etching through the control gate material and the gate insulator material and down to the metal oxide regions, the etching through forms control gates of the vertical channel transistors from the control gate material, and the etching through forms gate insulators between the polysilicon structures and the control gates from the gate insulator material;

etching away the metal oxide regions, the etching away forms voids directly under the control gates; and depositing an insulation material, a portion of the insulation material fills the voids.

2. The method of claim 1, wherein:
the etching away uses hot trimethyl-2-hydroxyethylammonium hydroxide without dilute hydrofluoric acid.

3. The method of claim 1, wherein:
the oxidizing of the regions of the metal line expands a volume and a height of the regions of the metal line.

4. The method of claim 3, wherein:
horizontal portions of the gate insulator material extend below bottom portions of the control gates; and
a height of the bottom portions of the control gates is set based on a height of the metal oxide regions and a thickness of the horizontal portions of the gate insulator material.

5. The method of claim 4, wherein:
the polysilicon layers comprises a middle polysilicon layer between a lower polysilicon layer and an upper polysilicon layer; and
the control gates overlap the lower polysilicon layer.

6. The method of claim 1, wherein:
the metal line comprises a second layer above a first layer;
an oxidation barrier layer is between the first layer and the second layer; and
the metal oxide regions are formed from the second layer but not the first layer.

7. The method of claim 6, wherein:
the oxidation barrier layer comprises titanium nitride.

8. The method of claim 1, further comprising:
oxidizing surfaces of the polysilicon structures to provide oxidized regions of the polysilicon structures; and
performing a cleaning process which removes the oxidized regions of the polysilicon structures, the cleaning process is performed after the oxidizing of the regions of the metal line and before the depositing the gate insulator material, and the cleaning process is selective to the oxidized regions of the polysilicon structures but not to the metal oxide regions.

9. The method of claim 8, wherein:
the cleaning process uses dilute hydrofluoric acid.

10. The method of claim 1, further comprising:
in connection with the etching of the layered semiconductor material, etching portions of the metal line which are adjacent to the polysilicon structure but not directly under the polysilicon structures, forming conductive pedestals in the metal lines under each of the bodies of the vertical channel transistors.

11. The method of claim 1, wherein:
the polysilicon structures comprise pillars.

12. The method of claim 1, wherein:
the metal line is a global bit line in a memory device; and
each polysilicon structure has a bottom which is electrically connected to the global bit line and a top which is electrically connected to a vertical bit line in the memory device.

13. The method of claim 1, wherein:
a distance between bottom portions of the control gates and top portions of the metal line is greater than a thickness of vertical portions of the gate insulator material.

14. The method of claim 1, wherein:
the gate insulator material comprises oxide.

15. The method of claim 1, wherein:
the control gate material comprises polysilicon.

16. A method for fabricating a semiconductor device, comprising:
forming a body of a vertical channel transistor above a metal line, the body of the vertical channel transistor and the metal line are carried on a substrate;
forming metal oxide regions extending upward from the metal line by oxidizing regions of the metal line;
depositing a gate insulator material;
depositing a control gate material on the gate insulator material, the control gate material provides a control gate of the vertical channel transistor, and the gate insulator material provides a spacer between the control gate and the body; and
replacing the metal oxide regions with an insulation to cause a bottom portion of the control gate material to be separated from the metal line by the gate insulator material and the insulation.

17. The method of claim 16, wherein:
the body comprises a middle polysilicon layer between a lower polysilicon layer and an upper polysilicon layer; and
a bottom portion of the control gate overlaps with the lower polysilicon layer.

18. The method of claim 16, wherein:
the forming of the body comprises etching a layered semiconductor material down to the metal line.

19. A method for fabricating a semiconductor device, comprising:
etching a layered semiconductor material, the layered semiconductor material comprising polysilicon layers above a metal line, the etching etches through the polysilicon layers and a portion of the metal line, forming polysilicon structures from the polysilicon layers, forming pedestal regions in the metal line and exposing regions of the metal line, each of the polysilicon structures is a body of a vertical channel transistor;
oxidizing the regions of the metal line to provide metal oxide regions;
after the oxidizing, depositing a gate insulator material followed by depositing a control gate material;
etching through the control gate material and the gate insulator material and down to the metal oxide regions, the etching through forms control gates of the vertical channel transistors from the control gate material, and the etching through forms gate insulators between the polysilicon structures and the control gates from the gate insulator material;
etching away the metal oxide regions, the etching away forms voids directly under the control gates; and
depositing an insulation, a portion of the insulation fills the voids.

20. The method of claim 19, wherein:
the body comprises a middle polysilicon layer between a lower polysilicon layer and an upper polysilicon layer; and
bottom portions of the control gates overlap with the lower polysilicon layer.

* * * * *